US012726187B2

(12) United States Patent
Uematsu et al.

(10) Patent No.: US 12,726,187 B2
(45) Date of Patent: Sep. 1, 2026

(54) SIGNAL TRANSMISSION DEVICE AND SIGNAL TRANSMISSION SYSTEM

(71) Applicant: Hitachi Astemo, Ltd., Hitachinaka (JP)

(72) Inventors: Yutaka Uematsu, Tokyo (JP); Toshiaki Takai, Hitachinaka (JP); Masahiro Toyama, Tokyo (JP); Masayoshi Takahashi, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 18/849,284

(22) PCT Filed: Mar. 1, 2023

(86) PCT No.: PCT/JP2023/007585
§ 371 (c)(1),
(2) Date: Sep. 20, 2024

(87) PCT Pub. No.: WO2023/210152
PCT Pub. Date: Nov. 2, 2023

(65) Prior Publication Data

US 2025/0219626 A1 Jul. 3, 2025

(30) Foreign Application Priority Data

Apr. 28, 2022 (JP) ................................ 2022-075430

(51) Int. Cl.
*H03K 5/1252* (2006.01)
*B60R 16/023* (2006.01)
*H04L 25/02* (2006.01)

(52) U.S. Cl.
CPC ....... *H03K 5/1252* (2013.01); *H04L 25/0272* (2013.01); *B60R 16/023* (2013.01)

(58) Field of Classification Search
CPC .............. B60R 16/023; B60R 16/0207; H04L 25/0272; H04L 1/203; H04L 25/0264;
(Continued)

(56) References Cited

U.S. PATENT DOCUMENTS 10,594,519 B2 3/2020 Bhagwat
11,444,657 B2 9/2022 Uematsu et al.
(Continued)

FOREIGN PATENT DOCUMENTS

JP 2017079398 A * 4/2017
WO WO-2020171202 A1 * 8/2020 ....... H04L 25/03885

OTHER PUBLICATIONS

Japanese Office Action issued in corresponding Japanese Patent Application No. JP2022-075430, mailed Jul. 15, 2025, with English Translation (6 Pages).

(Continued)

*Primary Examiner* — Sibin Chen
*Assistant Examiner* — James G Yeaman
(74) *Attorney, Agent, or Firm* — Foley & Lardner LLP

(57) ABSTRACT

A signal transmission device according to one aspect of the present invention is a signal transmission device that performs differential transmission, and includes an information processing circuit that performs processing of various types of information, and a power supply circuit that includes a voltage output circuit outputting a first applied voltage to a first signal wiring and outputting a second applied voltage to a second signal wiring. The information processing circuit includes an output voltage determination unit that determines an instruction value of at least one of the first applied voltage or the second applied voltage applied by the power supply circuit and that sends the determined instruction value to the power supply circuit. The power supply circuit has an output voltage adjustment function of adjusting a parameter of the voltage output circuit such that the first applied voltage or the second applied voltage reflecting the received instruction value are output to the first signal wiring and the second signal wiring.

11 Claims, 27 Drawing Sheets

(58) Field of Classification Search
CPC ... H04L 25/0276; H04L 25/08; H03H 1/0007; H03K 5/1252
See application file for complete search history.

(56) References Cited

U.S. PATENT DOCUMENTS

| | | | | |
|---|---|---|---|---|
| 2014/0211832 | A1* | 7/2014 | Diab | H04L 25/0266 375/219 |
| 2022/0190874 | A1 | 6/2022 | Uematsu et al. | |

OTHER PUBLICATIONS

International Search Report Written Opinion with translations of International Patent Application No. PCT/JP2023/007585 dated May 23, 2023 (10 pages).

* cited by examiner 1-1
ELECTRONIC DEVICE
9-1
41
OUTPUT VOLTAGE DETERMINATION UNIT
2-1
P
N
14P-1
14N-1
15-1
30-1
42
OUTPUT VOLTAGE ADJUSTMENT FUNCTION
$V_{IN}$
GND
$V_{OUTP}$
$V_{OUTN}$
$V_{bat}$
10-1
17P-1
17N-1
5-1
6-1
7-1
16-1
SIGNAL TRANSMISSION (POSITIVE)
SIGNAL TRANSMISSION (NEGATIVE)
8
16-2
6-2
7-2
5-2
17N-2
17P-2
10-2
1-2
ELECTRONIC DEVICE
15-2
30-2
$V_{IN}$
$V_{OUT2-1}$
$V_{OUT2-2}$
GND
14P-2
14N-2
2-2
9-2

Vout3=-(Vin1-Vin2)

59
65
DIAGNOSIS SERVER
STATE HISTORY STORAGE UNIT
60
61
INSURANCE COMPANY
MAINTENANCE COMPANY
PARTS MANUFACTURER
UPLOAD TO SERVER
1-1
ELECTRONIC DEVICE
16
1-2
P
N
8
6
7
5
Cm
Nd
15
14P
14N
2
9
43
49
NOISE AMOUNT GRASPING UNIT
OUTPUT VOLTAGE DETERMINATION UNIT
41
50
10
42
30
OUTPUT VOLTAGE ADJUSTMENT FUNCTION
$V_{OUT}$
$V_{IN}$
GND
$V_{bat}$
17N
17P

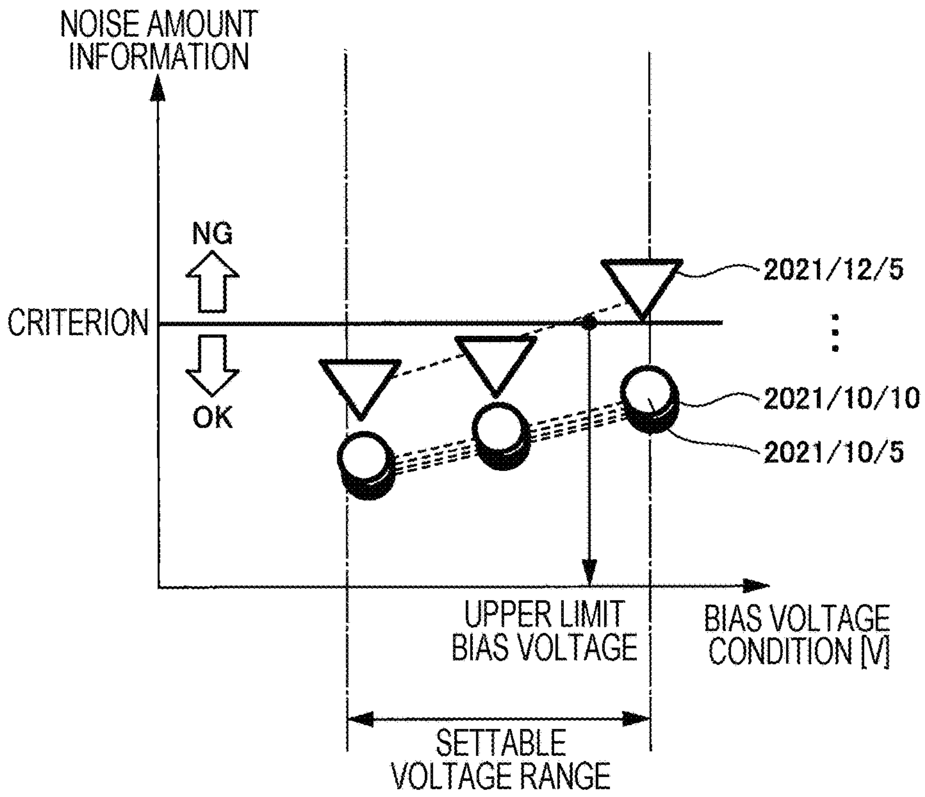
*FIG. 21*
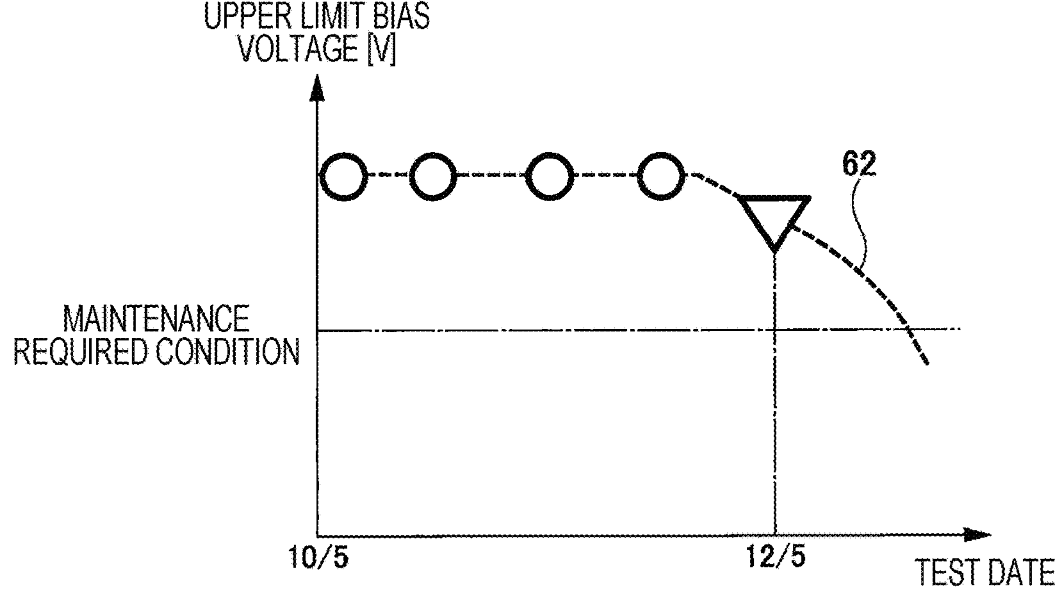

SIGNAL TRANSMISSION DEVICE AND SIGNAL TRANSMISSION SYSTEM

TECHNICAL FIELD

The present invention relates to a signal transmission device and a signal transmission system.

BACKGROUND ART

In recent years, in signal transmission between electronic devices mounted on vehicles, the speed of signal transmission using a twisted pair cable has been increased. For example, in the in-vehicle Ethernet, standardization has progressed from 100BASE-T1 for transmitting 100 Mbps or 1000BASE-T1 for transmitting 1 Gbps, which has been the mainstream up until now, to multi-gigabit Ethernet (registered trademark) or 25GBASE-T1 for enabling transmission of several Gbps or more. Further, also in MIPI A-Phy that is a communication standard for camera communication, standardization of a transmission speed of Gbps or more has progressed.

A challenge with such an increase in speed of in-vehicle cable transmission is to maintain electromagnetic compatibility (EMC) performance associated with high frequency. Since a current spectrum used for signal transmission exists at a high level up to a radio frequency region exceeding a GHz band, it is necessary to suppress radiation in the radio frequency band. In addition, at the same time, since a communication large-scale integration (LSI) has sensitivity to transmit and receive signals up to the GHz band, it is also necessary to suppress wraparound of noise in the GHz band.

In signal transmission by a differential method, ideally, a positive-side (hereinafter referred to as "P-side") transmission path and a negative-side (hereinafter referred to as "N-side") transmission path constituting a differential transmission path (differential wiring) are electrically symmetric. Accordingly, in a case where a reverse phase current flows through the differential transmission path, a magnetic field generated when the current flows through each transmission path (signal wiring) can be canceled, and radiation can be suppressed. In addition, when common noise (common mode noise) is superimposed on signal wirings of both transmission paths, the noise can be canceled by a differential receiver, and resistance to external noise can be improved.

However, in the P-side signal wiring and the N-side signal wiring constituting the differential transmission path, a differential balance is disturbed due to electrical characteristic variations caused by various factors. Since the differential balance is disturbed, the advantage of the differential transmission cannot be enjoyed, and the EMC performance deteriorates. The degree of variation in electrical characteristics of the differential transmission path is defined by mode conversion loss, and is used as a criterion for determination on the EMC performance particularly in a radio frequency region of 100 MHz or more. The mode conversion loss represents an amount by which a differential mode is converted into a common mode or an amount by which the common mode is converted into the differential mode in the differential wiring. When the mode conversion loss is large, an increase in radiation noise due to unintended generation of a common mode component or deterioration in noise resistance due to conversion of the common mode component into a differential component occurs.

As a background art related to the present invention, a technique described in PTL 1 is known. PTL 1 discloses a system (Power over Data Line: PoDL) in which electronic devices are connected by a twisted pair cable, and a differential signal and a power supply are superimposed on the twisted pair cable and transmitted. In this system, a DC cut-off capacitor is arranged on a signal line, and a filter element such as a common mode choke coil or an inductor is inserted as a PoDL filter on a power supply line. Accordingly, the differential signal and the power supply are separated according to the frequency range of the filter element.

CITATION LIST

Patent Literature

PTL 1: U.S. Ser. No. 10/594,519

SUMMARY OF INVENTION

Technical Problem

The technique described in PTL 1 reduces leakage of common mode noise from a communication circuit on a wiring board to a twisted pair cable and suppresses propagation of common mode noise picked up by the twisted pair cable to the communication circuit on the wiring board by arranging a filter element between the communication circuit and the twisted pair cable.

However, in a case where bias voltages having different potential differences from the ground are applied between the P side and the N side in electronic components constituting a transmission system, so that an electrical characteristic imbalance occurs, a mode conversion loss of the transmission path may increase, and the EMC performance may be deteriorated. For example, in an electrostatic protection element mounted on each of the signal wirings on the P side and the N side, a parasitic capacitance component may decrease according to the magnitude of the DC bias. In particular, at a radio frequency, it is a problem that this variation in parasitic capacitance contributes to an increase in mode conversion loss. Note that the mode conversion loss is expressed by a term "$S_{cd}$" in a parameter group representing an electrical characteristic of a transmission path by a mixed mode S-parameter.

From the above situation, there has been a demand for a method for suppressing an increase in mode conversion loss caused by variations in electrical characteristics of electronic components mounted on the P side and the N side due to application of different bias voltages.

Solution to Problem

In order to solve the above problem, a signal transmission device according to one aspect of the present invention is a signal transmission device including: a first signal wiring and a second signal wiring that constitute a differential wiring; a communication circuit for transmitting a differential signal to the differential wiring; an information processing circuit that is connected to the communication circuit and performs processing of various types of information; a first electronic component that is arranged between the first signal wiring and a ground wiring; a second electronic component that is arranged between the second signal wiring and the ground wiring; a power supply circuit that includes a voltage output circuit outputting a first applied voltage to the first signal wiring and outputting a second applied voltage to the second signal wiring; and a filter component that is arranged between the power supply circuit and each of the first signal wiring and the second signal wiring.

The information processing circuit includes an output voltage determination unit that determines an instruction value of at least one of the first applied voltage or the second applied voltage applied by the power supply circuit and that sends the determined instruction value to the power supply circuit.

The power supply circuit has an output voltage adjustment function of adjusting a parameter of the voltage output circuit such that the first applied voltage and the second applied voltage reflecting the instruction value received from the output voltage determination unit are output to the first signal wiring and the second signal wiring.

Advantageous Effects of Invention

According to at least one aspect of the present invention, it is possible to suppress an increase in mode conversion loss caused by variations in electrical characteristics of electronic components mounted on a P side and an N side due to application of different bias voltages to differential wirings.

Problems, configurations, and effects other than those described above will be clarified by the following description of embodiments.

BRIEF DESCRIPTION OF DRAWINGS

FIG. 21 is a diagram illustrating an example of a data set obtained by the signal transmission system using the electronic device to which the signal transmission device according to the fourteenth embodiment of the present invention is applied and an estimated curve of an upper limit bias voltage.

DESCRIPTION OF EMBODIMENTS

Figure 1:
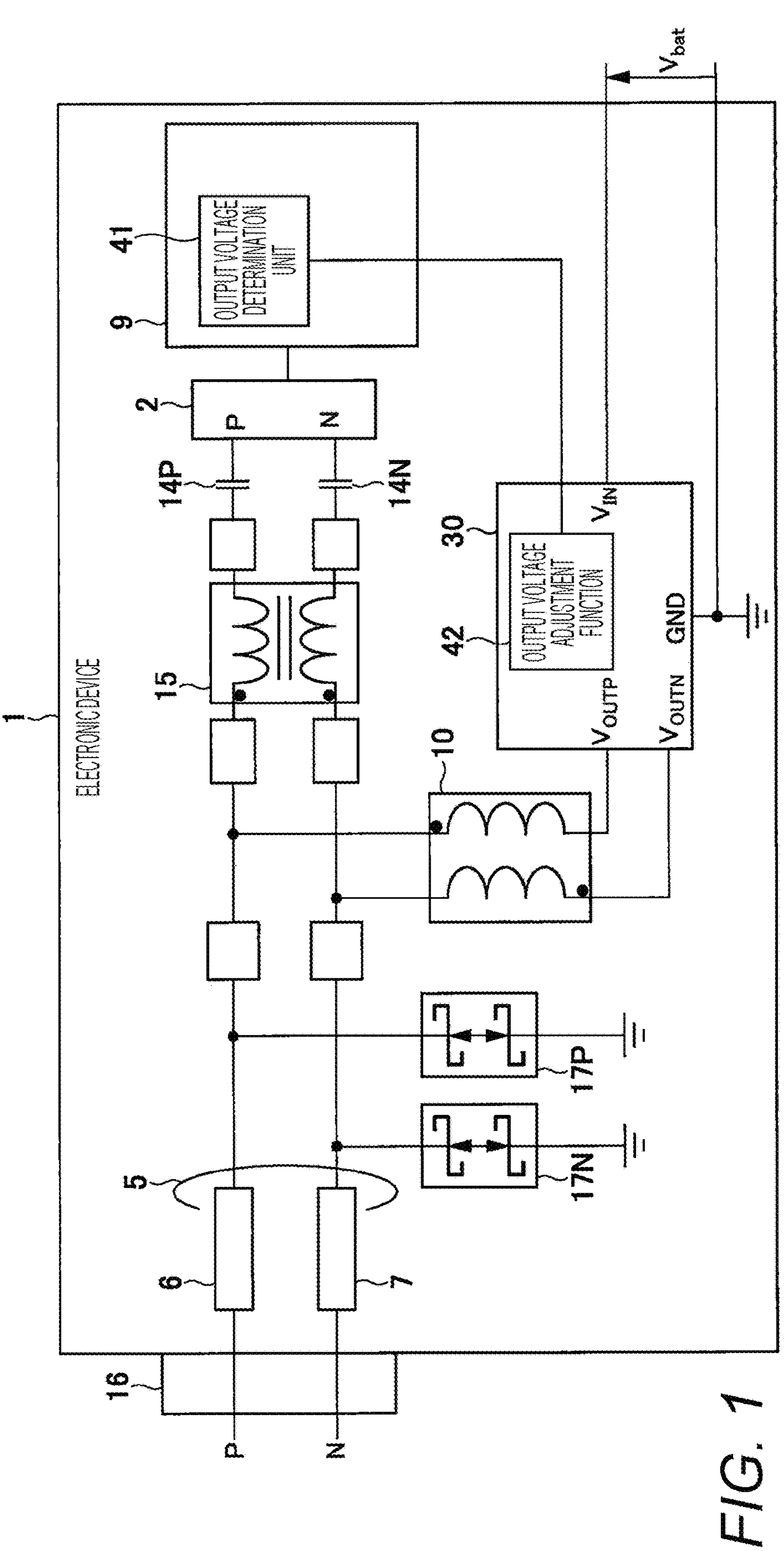
FIG. 1 is a diagram illustrating a configuration example of an electronic device to which a signal transmission device according to a first embodiment of the present invention is applied.

Hereinafter, examples of modes for carrying out the present invention (hereinafter, referred to as "embodiments") will be described with reference to the accompanying drawings. In the present specification and the accompanying drawings, the same components or components having substantially the same function are denoted by the same reference numerals, and redundant description is omitted. In a case where there are a plurality of components having the same or similar functions, the same reference numerals may be attached with different subscripts for description. However, in a case where it is not necessary to distinguish the plurality of components, the description may be given with the subscript omitted.

The description and drawings in the following specification are examples for describing the present invention, and are omitted and simplified as appropriate for the sake of clarity of description. The present invention can be implemented in various other forms. Unless otherwise specified, each component may be singular or plural.

In order to facilitate understanding of the invention, circuit configurations, functional blocks, and the like illustrated in the drawings may not represent all circuit elements, wirings, functional blocks, and the like. Therefore, the present invention is not necessarily limited to the circuit elements, circuit arrangements, wirings, functional blocks, and the like disclosed in the drawings.

First Embodiment

FIG. 1 is a diagram illustrating a configuration example of an electronic device to which a signal transmission device according to a first embodiment of the present invention is applied.

An electronic device 1 illustrated in FIG. 1 is connected to a cable (for example, a twisted pair cable 8 of FIG. 5) including a pair of electric wires via a cable connector 16, is connected to another external electronic device (for example, an electronic device 1-2 of FIG. 5), and performs signal transmission. The electronic device 1 includes a communication LSI 2 (an example of a communication circuit) that performs communication by differential transmission with another electronic device via a differential wiring 5 connected to the cable connector 16. The communication LSI 2 and the cable connector 16 are connected by the differential wiring 5 laid out on a printed wiring board. The differential wiring 5 includes a pair of P-side signal wiring 6 (positive-side signal wiring) and N-side signal wiring 7 (negative-side signal wiring).

The communication LSI 2 is connected to an information processing LSI 9 (an example of an information processing circuit). The information processing LSI 9 exchanges data with the communication LSI 2 to process various types of information. The communication LSI 2 includes an output voltage determination unit 41. The output voltage determination unit 41 determines an instruction value of at least one of the voltage applied to the P-side signal wiring 6 by the power supply circuit 30 or the voltage applied to the N-side signal wiring 7, and sends the determined instruction value to the power supply circuit 30.

The electronic device 1 further includes the power supply circuit 30 for superimposing a power supply on the P-side signal wiring 6 and the N-side signal wiring 7 of the differential wiring 5, and a power supply superimposing filter 10. For example, the power supply circuit 30 can be configured as a power supply IC including a DC/DC converter. In the present embodiment, the power supply circuit 30 includes a voltage output circuit (not illustrated) that generates and outputs a voltage to be superimposed as a power supply on the P-side signal wiring 6 and the N-side signal wiring 7, and an output voltage adjustment function 42 that outputs an instruction value for adjusting the output voltage of the voltage output circuit. In the power supply circuit 30, a battery voltage $V_{bat}$ is applied between an input terminal $V_{IN}$ and a ground terminal GND. The voltage output circuit uses the battery voltage $V_{bat}$ to generate a voltage to be superimposed as a power supply on the differential wiring 5. The voltage output circuit outputs the generated P-side voltage from an output terminal $V_{OUTP}$ to a P-side terminal of the power supply superimposing filter 10, and outputs the generated N-side voltage from an output terminal $V_{OUTN}$ to an N-side terminal of the power supply superimposing filter 10.

The power supply superimposing filter 10 has a function of connecting a power supply line on which a power supply is superimposed and a signal line through which a signal is transmitted. For example, the power supply superimposing filter 10 can be configured using a PoDL filter.

Between the communication LSI 2 and the cable connector 16, that is, on the differential wiring 5, AC coupling capacitors 14P and 14N for cutting a DC potential, and a common mode choke coil (CMCC) 15 for reducing common mode noise that has flowed into the communication LSI 2 and degrades the EMC performance are connected. In addition, an electrostatic protection element 17P for avoiding electrostatic breakdown is mounted between the P-side signal wiring 6 and the ground wiring, and an electrostatic protection element 17N is mounted between the N-side signal wiring 7 and the ground wiring.

Note that the configuration illustrated in FIG. 1 is a general circuit configuration, and components (examples: common mode termination component, filter component, or the like) other than those described herein may be added, and some of the electronic components described herein may not be included in the components. In addition, the arrangement of the circuit configuration may be different. For example, the case where the arrangement of the circuit configuration is different is a case where a PoDL filter is inserted between the common mode choke coil and the AC coupling capacitor.

The components of the electronic device 1 according to the first embodiment of the present invention are characterized in that the power supply circuit 30 is provided with the output voltage adjustment function 42, and the information processing LSI 9 is provided with the output voltage determination unit 41 for determining the voltage value of the voltage adjusted by the output voltage adjustment function 42.

[Conventional Electronic Device]

Figure 2:
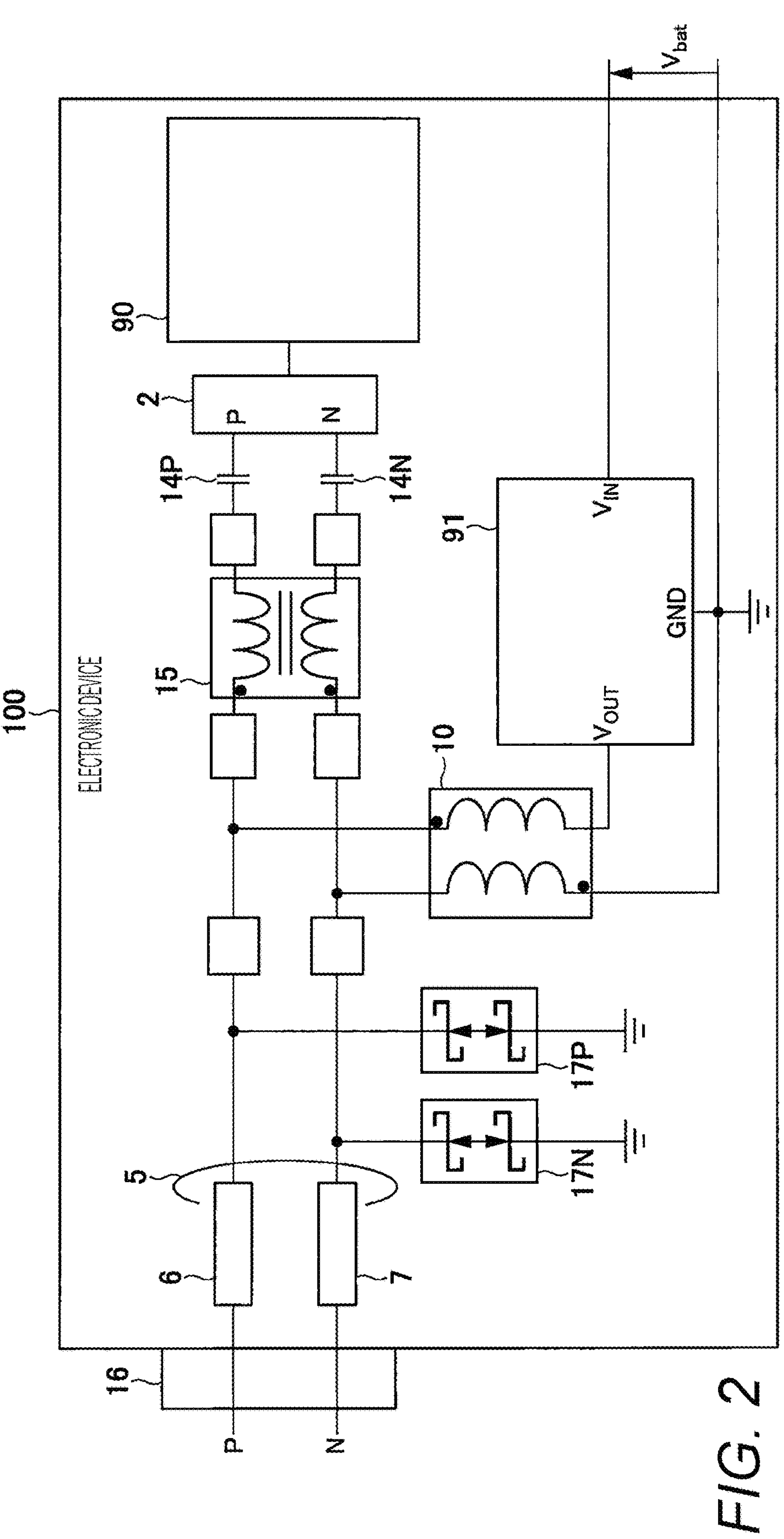
FIG. 2 is a diagram illustrating a configuration example of an electronic device to which a conventional signal transmission device is applied.

FIG. 2 is a diagram illustrating a configuration example of an electronic device to which a conventional signal transmission device is applied.

The configuration of a conventional electronic device 100 illustrated in FIG. 2 includes an information LSI 90 and a power supply circuit 91. Other configurations of the electronic device 100 are the same as those of the electronic device 1 illustrated in FIG. 1. That is, the conventional electronic device 100 does not include two components of the output voltage adjustment function 42 mounted on the power supply circuit 30 of the electronic device 1 and the output voltage determination unit 41 mounted on the information processing LSI 9. Note that the power supply circuit 91 of the electronic device 100 includes one input terminal $V_{IN}$, one output terminal $V_{OUT}$, and the ground terminal GND. Then, the output terminal $V_{OUT}$ of the power supply circuit 91 and the P-side terminal of the power supply superimposing filter 10 are connected, and the ground terminal GND of the power supply circuit 91 and the N-side terminal of the power supply superimposing filter 10 are connected.

Incidentally, there is a mode conversion loss as an index representing the EMC performance of the transmission path of the electronic device 1. As a method of evaluating the EMC performance, a method of measuring a mode conversion loss "$S_{cd,11}$" measured from the cable connector 16 by utilizing a network analyzer is common. "$S_{cd,11}$" represents a case where the signal input to the input terminal is in a differential mode and the output from the output terminal is in a common mode (in-phase mode). It is possible to determine the pass or fail of the EMC performance by confirming whether the measured value of "$S_{cd,11}$" is smaller than a target value. Examples of such an electronic device include an electronic control unit for automatic driving (AD-ECU) and an electronic control unit for advanced driving assistance system (ADAS-ECU) of an automobile.

Note that, in the present specification, the electronic device to which the present invention is applied will be described on the premise of an in-vehicle device, but the present invention can also be utilized in other forms using a similar communication system. For example, the present invention can exert a similar effect also in communication between an industrial robot and an electronic camera.

Figure 3:
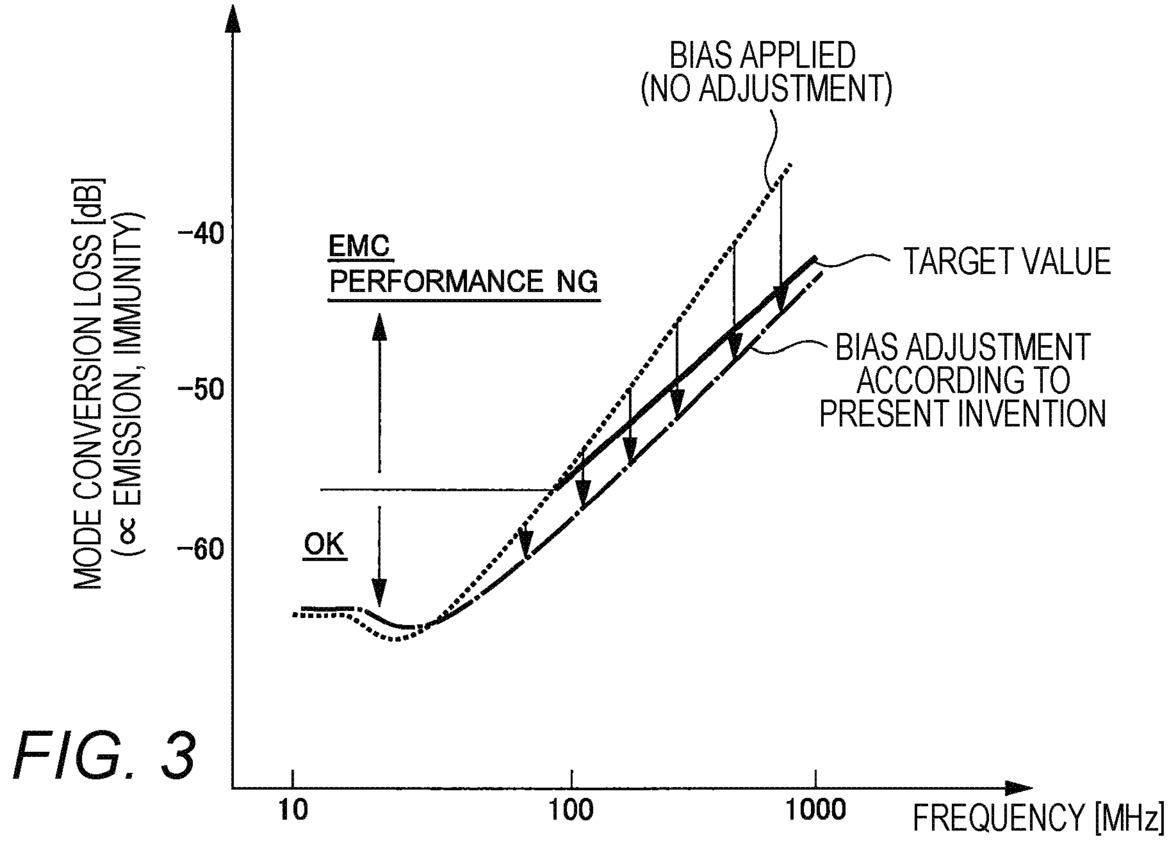
FIG. 3 is a graph illustrating an example of a change in mode conversion loss performance depending on presence or absence of bias application (output voltage adjustment) to an output voltage of a power supply circuit.

FIG. 3 is a graph illustrating an example of a change in mode conversion loss performance depending on presence or absence of bias application (output voltage adjustment) to the output voltage of the power supply circuit 30. A horizontal axis represents the frequency [MHz] of the transmission signal, and a vertical axis represents the mode conversion loss [dB].

Figure 4:
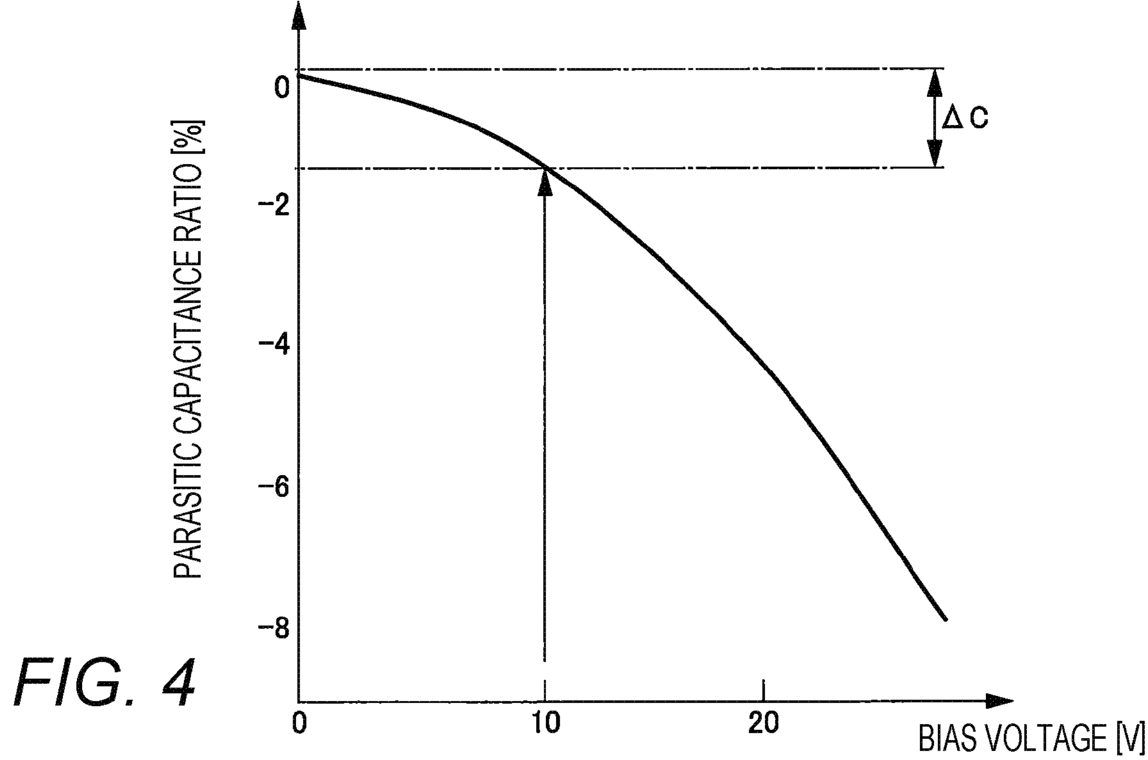
FIG. 4 is a graph illustrating bias voltage dependency of a parasitic capacitance of an electrostatic protection element.

FIG. 4 is a graph illustrating bias voltage dependency of a parasitic capacitance of the electrostatic protection element. A horizontal axis represents a bias voltage [V] with respect to the electrostatic protection element, and a vertical axis represents a parasitic capacitance ratio [%].

For example, in a case where the DC bias voltage (DC voltage) of 10 V is superimposed only on the P side of the differential wiring 5 by the power supply circuit 30, DC voltages of 10 V and 0 V with respect to the ground are applied to the electrostatic protection elements 17P and 17N connected to the P side and the N side of the differential wiring 5, respectively. At this time, assuming that the target electrostatic protection elements 17P and 17N have the bias voltage dependency of the parasitic capacitance as illustrated in FIG. 4, only the parasitic capacitance of the P-side electrostatic protection element 17P decreases by about 2%. Accordingly, a variation AC in parasitic capacitance occurs between the P-side electrostatic protection element 17P and the N-side electrostatic protection element 17N, and a characteristic curve such as "bias application (no adjustment)" indicated by a broken line in FIG. 3 is obtained. In the case of characteristics such as "bias application (no adjustment)", it is conceivable that the mode conversion loss exceeds the target value indicated by a solid line and the noise performance deteriorates.

In this regard, in the present invention, the mode conversion loss of the differential wiring 5 is reduced by adjusting the output voltage of the power supply circuit 30 in the output voltage adjustment function 42. For example, in a case where the output voltage adjustment function 42 has a function of adjusting the output voltage only on the P side of the differential wiring 5, the output voltage adjustment function 42 lowers the output voltage of the power supply circuit 30 connected to the P-side signal wiring 6 within a voltage value range defined in advance as an output voltage range, so as to increase the parasitic capacitance of the electrostatic protection element 17P. However, it is a matter of course that the output voltage adjustment function 42 may have a function of adjusting the N-side output voltage.

The output voltage adjustment function 42 adjusts the output voltage so as to satisfy the condition of the parasitic capacitance of the electrostatic protection elements 17P and 17N, on the basis of the output voltage information (as an example, a noise amount-bias voltage relationship to be described later) obtained from an external device (for example, the output voltage determination unit 41 of the information processing LSI 9 or an information processing terminal outside the electronic device 1). Accordingly, it is possible to suppress the mode conversion loss and satisfy the target value as in the characteristic curve of a one-dot chain line indicated as "bias adjustment according to the present invention" in FIG. 3.

As described above, the signal transmission device (electronic device 1) according to the first embodiment of the present invention includes: a first signal wiring (P side) and a second signal wiring (N side) that constitutes a differential wiring; a communication circuit (for example, the communication LSI 2) for transmitting a differential signal to the differential wiring; an information processing circuit (for example, the information processing LSI 9) that is connected to the communication circuit and performs information processing; a first electronic component (for example, the electrostatic protection element 17P) that is arranged between the first signal wiring and a ground wiring; a second electronic component (for example, the electrostatic protection element 17N) that is arranged between the second signal wiring and the ground wiring; a power supply circuit (for example, the power supply circuit 30) that includes a voltage output circuit outputting a first applied voltage to the first signal wiring and outputting a second applied voltage to the second signal wiring; and a filter component (for example, the power supply superimposing filter 10) that is arranged between the power supply circuit and each of the first signal wiring and the second signal wiring.

The information processing circuit includes an output voltage determination unit (for example, the output voltage determination unit 41) that determines an instruction value of at least one of the first applied voltage or the second applied voltage applied by the power supply circuit and that sends the determined instruction value to the power supply circuit.

The power supply circuit has an output voltage adjustment function (for example, the output voltage adjustment function 42) of adjusting a parameter of the voltage output circuit such that the first applied voltage and the second applied voltage reflecting the instruction value (for example, the DC bias voltage) received from the output voltage determination unit are output to the first signal wiring and the second signal wiring. This parameter is, for example, the number of steps (change amount) of voltage change of a circuit having a step-up/step-down function illustrated in FIGS. 7 and 8 to be described later.

In the signal transmission device (electronic device 1) according to the first embodiment described above, the output voltage adjustment function 42 is provided in the power supply circuit 30, and the output voltage determination unit 41 is provided in the information processing LSI 9. Then, in the present embodiment, at least one of the P-side output voltage and the N-side output voltage of the power supply circuit 30 is adjusted by the output voltage adjustment function 42 and the output voltage determination unit 41, such that a mode conversion loss due to variation in electrical characteristics of electronic components mounted on the P side and the N side due to application of different bias voltages to the differential wiring 5 is reduced. Accordingly, an increase in the mode conversion loss can be suppressed, and the EMC performance of the signal transmission device (differential transmission path) can be improved.

Second Embodiment

Figure 5:
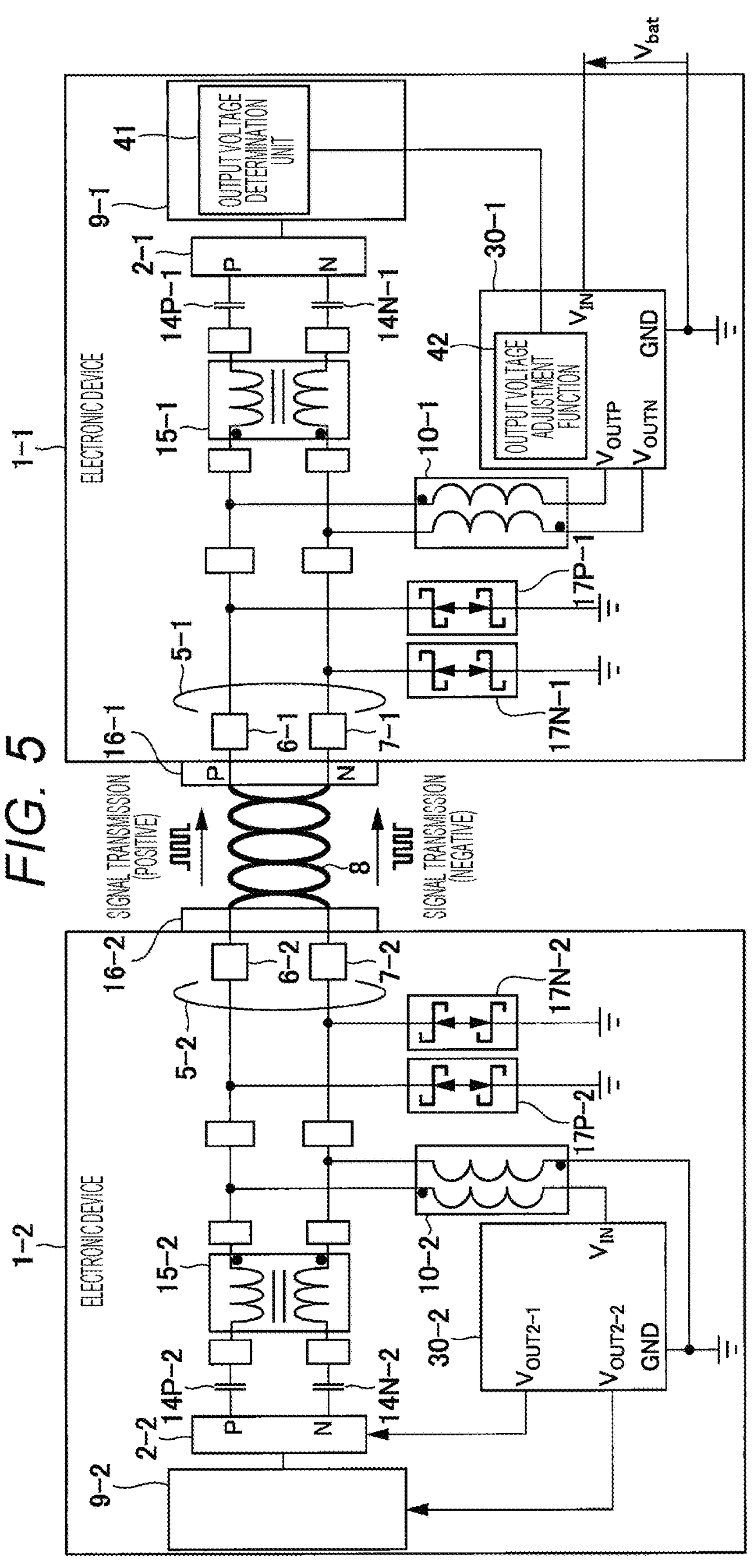
FIG. 5 is a diagram illustrating a configuration example of a signal transmission system using an electronic device to which a signal transmission device according to a second embodiment of the present invention is applied.

FIG. 5 is a diagram illustrating a configuration example of a signal transmission system using an electronic device to which a signal transmission device according to a second embodiment of the present invention is applied.

FIG. 5 illustrates an example of the signal transmission system in which an electronic device 1-1 to which the signal transmission device (the electronic device 1 in FIG. 1) according to the first embodiment is applied is connected to another external electronic device 1-2 via the twisted pair cable 8. Most of the electronic device 1-1 and the electronic device 1-2 have the same configuration, the same components are denoted by the same reference numerals, and the same reference numerals are denoted by different subscripts for distinction between the electronic device 1-1 and the electronic device 1-2. That is, each component of the electronic device 1-1 is attached with a subscript "−1", and each component of the electronic device 1-2 is attached with a subscript "−2".

However, a power supply circuit 30-2 of the electronic device 1-2 is different from a power supply circuit 30-1 of the electronic device 1-1. The power supply circuit 30-2 includes an input terminal $V_{IN}$ connected to the P-side terminal of the power supply superimposing filter 10-2 and a ground terminal GND connected to the N-side terminal of the power supply superimposing filter 10-2. In addition, the power supply circuit 30-2 includes an output terminal $V_{OUT-1}$ that supplies power to the communication LSI 2-2 and an output terminal $V_{OUT-2}$ that supplies power to the information processing LSI 9-2.

In the signal transmission system illustrated in FIG. 5, during signal transmission, the output voltage value is determined by the output voltage determination unit 41 of the information processing LSI 9-1 of the electronic device 1-1, and the output voltage is adjusted by the output voltage adjustment function 42 of the power supply circuit 30-1. Accordingly, it is possible to improve noise resistance against radiation at the time of signal transmission of a cable (for example, the twisted pair cable 8) starting from the electronic device 1-2 and external common mode noise in the electronic device 1-2.

Note that, in the example of FIG. 5, the electronic device 1 to which the signal transmission device according to the above-described first embodiment is applied is applied only to the electronic device 1-1. However, the signal transmission device according to the first embodiment may be applied to both the electronic device 1-1 and the electronic device 1-2.

Third Embodiment

Figure 6:
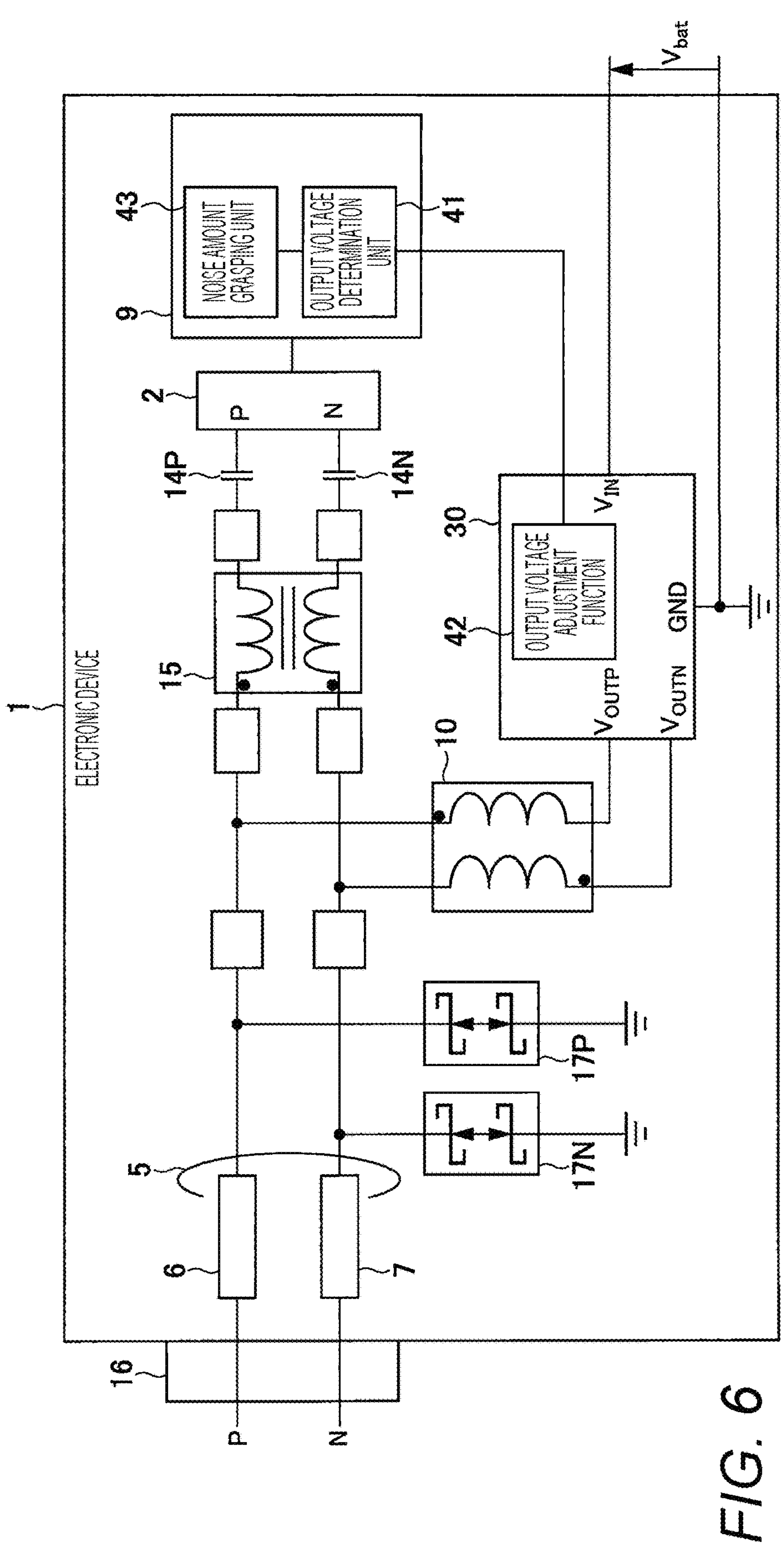
FIG. 6 is a diagram illustrating a configuration example of an electronic device to which a signal transmission device according to a third embodiment of the present invention is applied.

FIG. 6 is a diagram illustrating a configuration example of an electronic device to which a signal transmission device according to a third embodiment of the present invention is applied.

The third embodiment is the invention in which a noise amount grasping unit 43 is provided in the information processing LSI 9 and the noise amount in the differential wiring 5 of the target signal transmission system is grasped to reflect the system noise amount in the determination process of the output voltage determination unit 41. That is, the electronic device 1 according to the present embodiment has a function of optimizing the output voltage of the power supply circuit 30 in accordance with the noise amount.

A detailed procedure of the output voltage determination using the present function will be described in a tenth embodiment (FIGS. 14 to 16) to be described later. In addition, a more specific configuration and operation of the noise amount grasping unit 43 will be described in an eleventh embodiment (FIG. 17) and a twelfth embodiment (FIG. 18) to be described later.

As described above, in the signal transmission device (electronic device 1) according to the third embodiment, the information processing circuit (information processing LSI 9) includes the noise amount grasping unit (noise amount grasping unit 43) that grasps the noise amount in the first signal wiring and the second signal wiring. The output voltage determination unit (output voltage determination unit 41) determines an instruction value (bias voltage) so as to reduce the noise amount for at least one voltage of the first applied voltage (for example, P side) and the second applied voltage (for example, N side) on the basis of the grasping result of the noise amount grasping unit, and outputs the instruction value to the power supply circuit (output voltage adjustment function 42).

According to the signal transmission device (electronic device 1) according to the third embodiment described above, the bias voltage can be determined on the basis of the grasping result of the noise amount grasping unit, and thus the output voltage can be dynamically adjusted in accordance with the state of the differential transmission path during the operation of the signal transmission system, and dynamic noise reduction can be realized. In addition, by providing the noise amount grasping unit 43 in the information processing LSI 9, the low noise adjustment as described above can be realized without an additional component.

Fourth Embodiment

Figure 7:
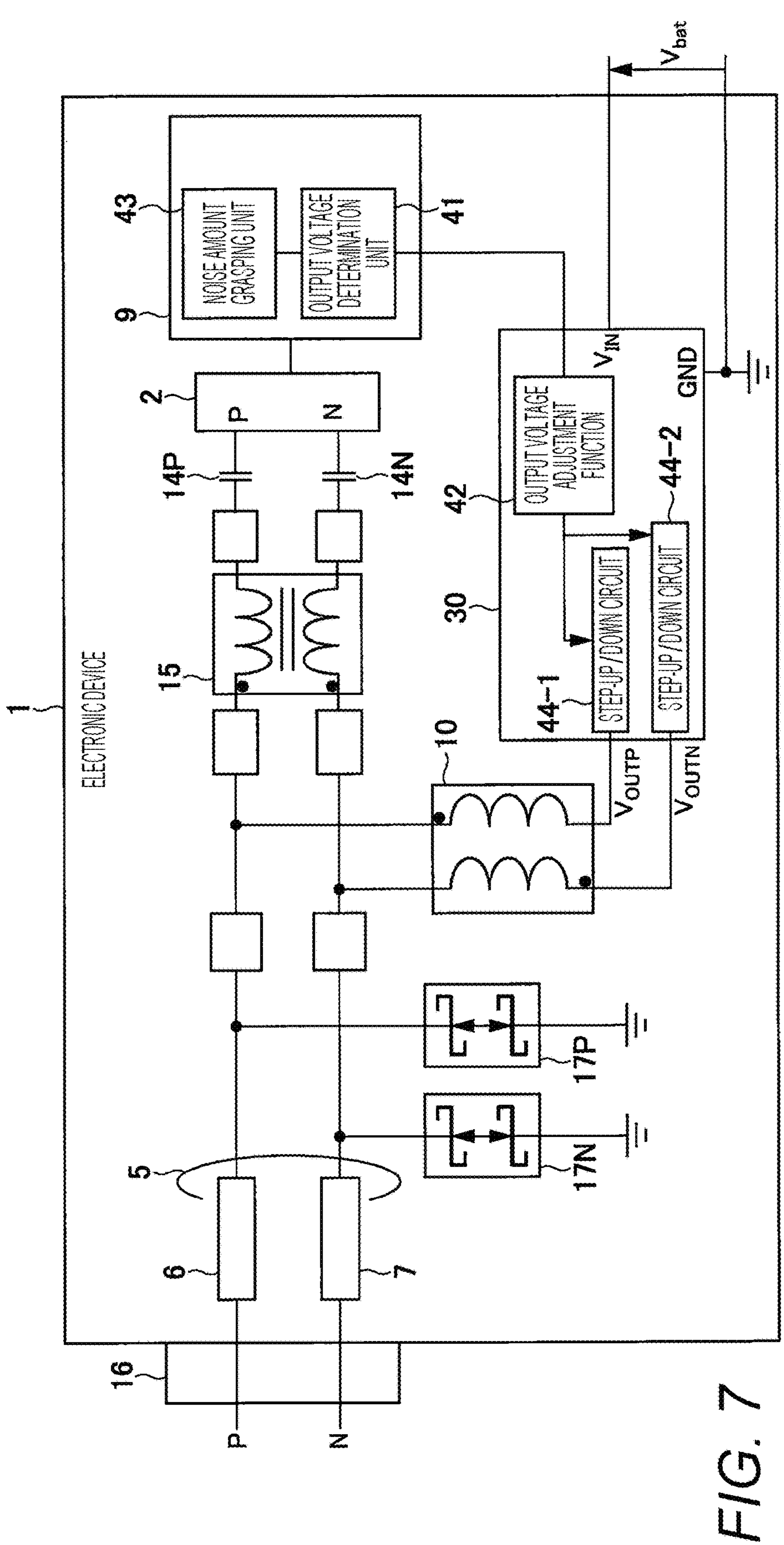
FIG. 7 is a diagram illustrating a configuration example of an electronic device to which a signal transmission device according to a fourth embodiment of the present invention is applied.

FIG. 7 is a diagram illustrating a configuration example of an electronic device to which a signal transmission device according to a fourth embodiment of the present invention is applied.

In the fourth embodiment, the power supply circuit 30 is provided with a step-up/down circuit 44-1 connected to the output terminal $V_{OUTP}$ connected to the P-side terminal of the power supply superimposing filter 10 and a step-up/down circuit 44-2 connected to the output terminal $V_{OUTN}$ connected to the N-side terminal of the power supply superimposing filter 10, and the output voltages of both are adjusted by the output voltage adjustment function 42. That is, in the electronic device 1 according to the present embodiment, the applied bias voltages on the P side and the N side can be adjusted independently, and thus the number of options of the applied bias voltage can be increased even when the potential difference between the P side and the N side remains the same. Accordingly, it is possible to select the set value of the output voltage in a direction in which the noise amount is further reduced, so that the noise amount reduction can be easily optimized.

The step-up/down circuits 44-1 and 44-2 are examples of the voltage output circuit, and can be configured using, for example, a step-up charge pump circuit having a function (dynamic voltage scaling (VCS)) capable of dynamically raising and lowering an input voltage by register setting. For example, the output voltage dynamically changes by appropriately setting the number of steps (change amount) of voltage change as the parameter of the step-up charge pump circuit. Note that in the example of FIG. 7, the output voltage adjustment function 42 and the step-up/down circuits 44-1 and 44-2 are separately described, but a circuit that implements the output voltage adjustment function 42 may also incorporate the step-up/down circuits 44-1 and 44-2.

Fifth Embodiment

Figure 8:
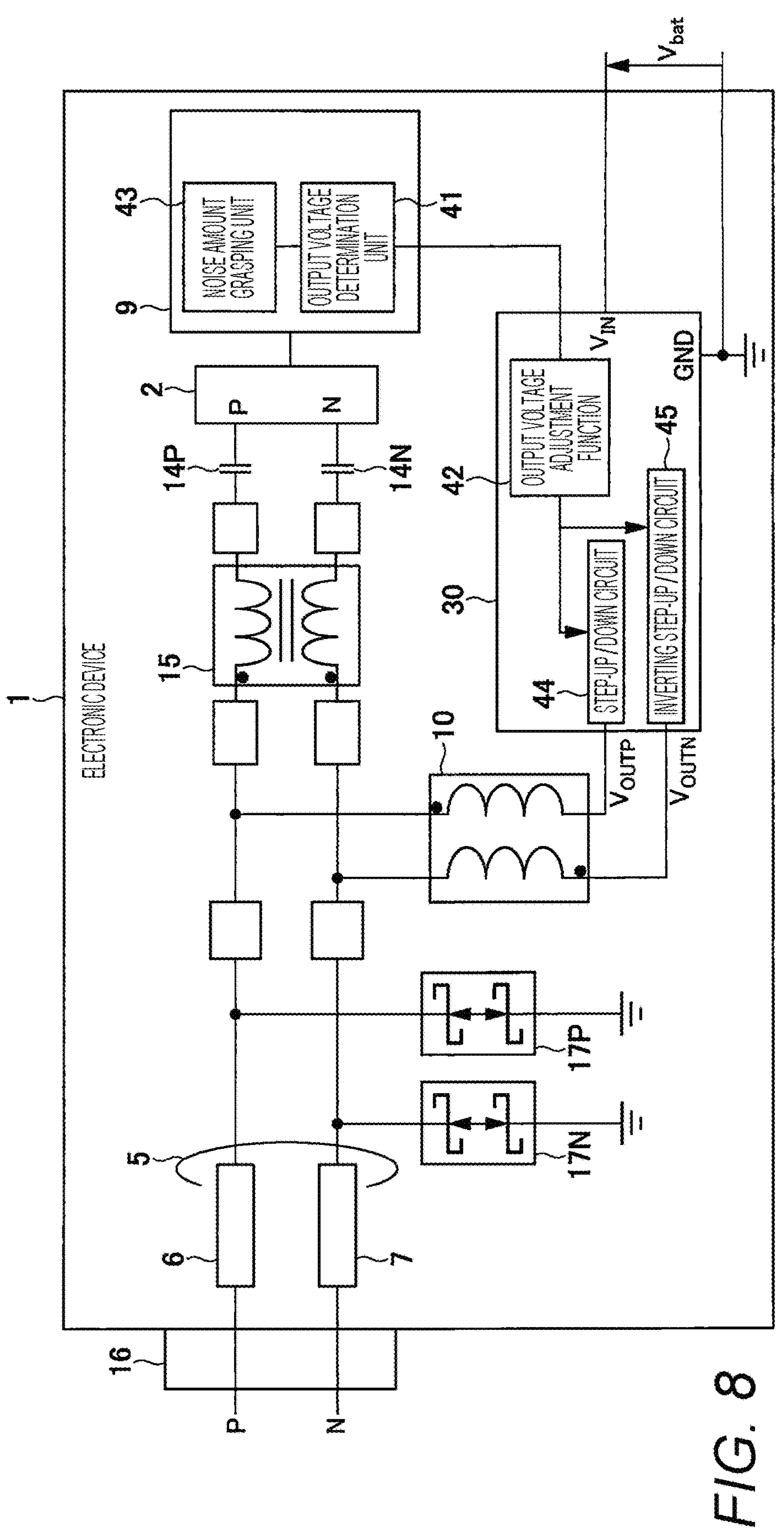
FIG. 8 is a diagram illustrating a configuration example of an electronic device to which a signal transmission device according to a fifth embodiment of the present invention is applied.

FIG. 8 is a diagram illustrating a configuration example of an electronic device to which a signal transmission device according to a fifth embodiment of the present invention is applied.

In the fifth embodiment, the power supply circuit 30 is provided with the step-up/down circuit 44 connected to the output terminal $V_{OUTP}$ connected to the P-side terminal of the power supply superimposing filter 10 and an inverting step-up/down circuit 45 connected to the output terminal $V_{OUTN}$ connected to the N-side terminal of the power supply superimposing filter 10, and the output voltages of both are adjusted by the output voltage adjustment function 42. That is, the electronic device 1 according to the present embodiment can set a positive applied bias voltage on the P side and a negative applied bias voltage on the N side. Further, the electronic device has a function of independently adjusting applied bias voltages on the P side and the N side. The feature of the configuration according to the present embodiment is that the potential differences (absolute values of two applied bias voltages) from the ground on the P side and the N side can be made approximately the same.

When the parasitic capacitances of the electrostatic protection elements 17P and 17N depend on the potential difference from the ground regardless of the polarity of the bias voltage, it is possible to further reduce the electrical characteristic imbalance by applying the same positive/negative potential difference to the P-side signal wiring 6 and the N-side signal wiring 7 as in this configuration. For example, in a case where it is desired to generate a potential difference of 10 V between the P side and the N side, a potential of +5 V is applied to the P side and a potential of −5 V is applied to the N side. Accordingly, an equivalent potential difference with respect to the ground is applied to the electrostatic protection elements 17P and 17N.

The step-up/down circuit 44 has the same configuration as the step-up/down circuits 44-1 and 44-2 illustrated in FIG. 7, and has a function capable of dynamically stepping up the input voltage to a positive output voltage. In addition, the inverting step-up/down circuit 45 can be configured by using, for example, a step-up charge pump circuit having a function (VCS) capable of dynamically raising and lowering an input voltage to a negative output voltage by register setting.

Note that in the example of FIG. 8, the output voltage adjustment function 42, the step-up/down circuit 44, and the inverting step-up/down circuit 45 are separately described, but a circuit that implements the output voltage adjustment function 42 may incorporate the step-up/down circuit 44 and the inverting step-up/down circuit 45.

As described above, the signal transmission device (electronic device 1) according to the fifth embodiment is configured to adjust the parameter of the voltage output circuit (step-up/down circuit 44, inverting step-up/down circuit 45) such that a positive voltage is output to the first signal wiring and a negative voltage is output to the second signal wiring by the output voltage adjustment function (output voltage adjustment function 42) of the power supply circuit.

According to the signal transmission device according to the present embodiment configured as described above, the absolute values of the voltages applied to the P-side and N-side electronic components (for example, the electrostatic protection elements) can be aligned to be approximately the same, so that noise can be further reduced as compared with the fourth embodiment.

Sixth Embodiment

Figure 9:
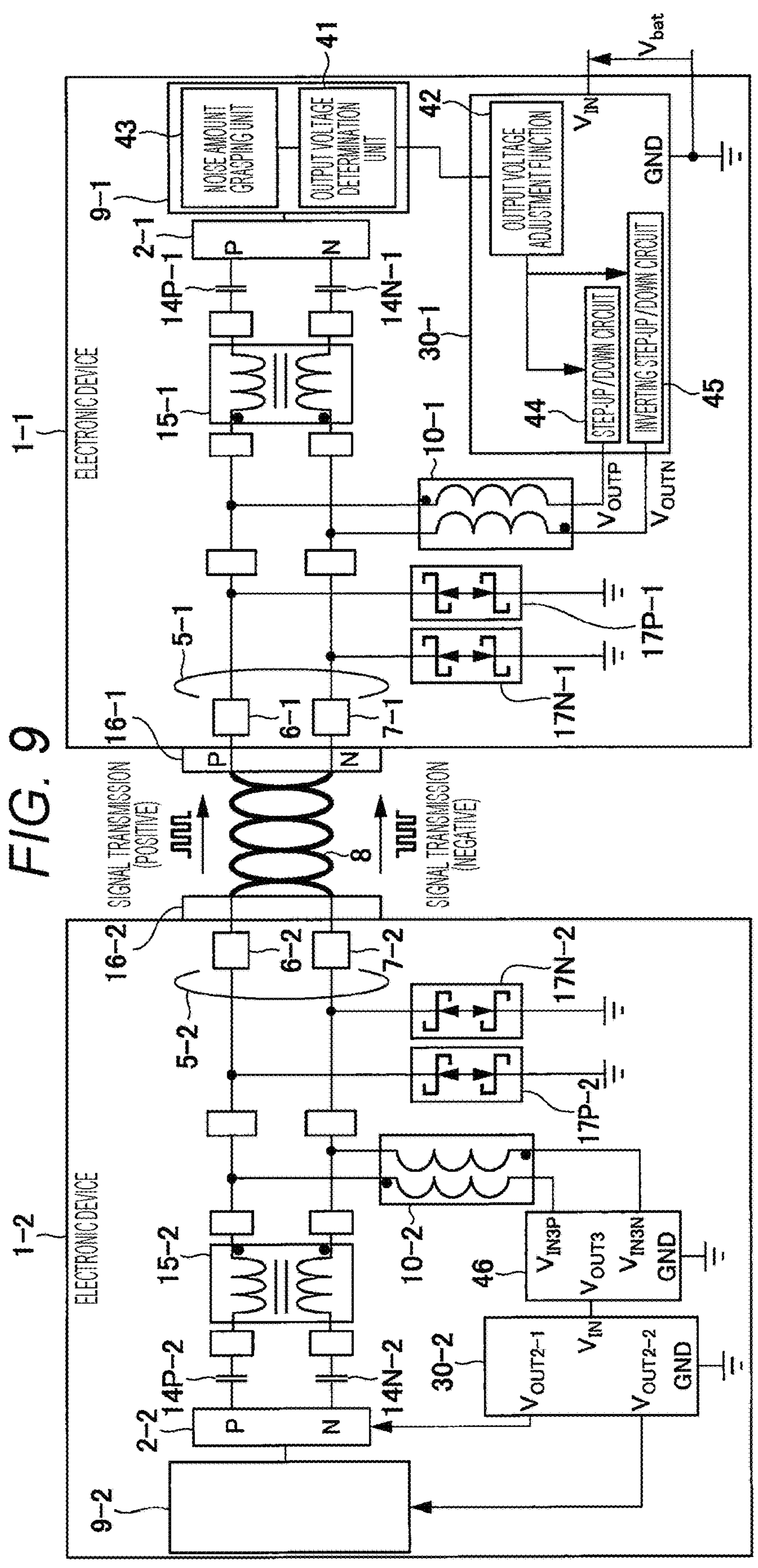
FIG. 9 is a diagram illustrating a configuration example of a signal transmission system using an electronic device to which a signal transmission device according to a sixth embodiment of the present invention is applied.

FIG. 9 is a diagram illustrating a configuration example of a signal transmission system using an electronic device to which a signal transmission device according to a sixth embodiment of the present invention is applied.

FIG. 9 illustrates an example of a signal transmission system in which the electronic device 1-1 to which the signal transmission device (the electronic device 1 of FIG. 8) according to the fifth embodiment is applied is connected to another external electronic device 1-2 via the twisted pair cable 8. This signal transmission system is configured such that the current supplied from the power supply circuit 30-1 of the electronic device 1-1 is received by the power supply circuit 30-2 of the electronic device 1-2, and the current is distributed to various electronic components mounted on the electronic device 1-2.

However, in a case where the power supply circuit 30-2 (input to the input terminal $V_{IN}$) defines the input voltage with reference to the ground, the positive and negative voltages output from the power supply circuit 30-1 of the electronic device 1-1 cannot be input as they are. Therefore, it is a feature of the present system to adopt a configuration in which a differential-to-single-end conversion circuit 46 is interposed between the power supply circuit 30-2 and the power supply superimposing filter 10-2 to convert the potential of the differential signal into a ground reference potential. By adopting this configuration, the noise reduction effect of the entire system can be achieved. That is, in the present embodiment, the electronic device 1-1 of the communication partner of the electronic device 1-2 includes the differential-to-single-end conversion circuit 46.

Figure 10:
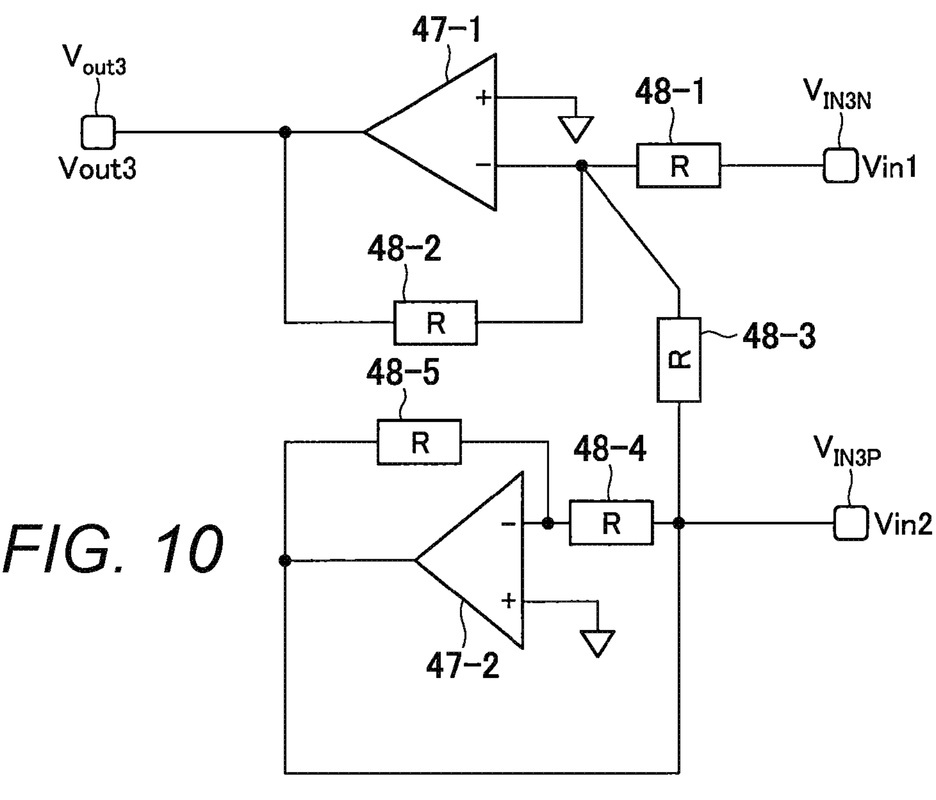
FIG. 10 is a diagram illustrating a configuration example of a differential-to-single-end conversion circuit included in the electronic device to which the signal transmission device according to the sixth embodiment of the present invention is applied.

FIG. 10 is a diagram illustrating a configuration example of the differential-to-single-end conversion circuit 46 included in the electronic device to which the signal transmission device according to the sixth embodiment of the present invention is applied. As illustrated in FIG. 10, the differential-to-single-end conversion circuit 46 can generate a ground reference single-end voltage by utilizing high-precision operational amplifiers 47-1 and 47-2 and a plurality of resistance components 48-1 to 48-5. For example, an example of the differential-to-single-end conversion circuit 46 is described in a web page specified by the following uniform resource locator (URL).

[URL]

https://www.analog.com/jp/analog-dialogue/raqs/raq-issue-145.html

Note that since this circuit configuration has a negative gain, the negative voltage Vin1 and the positive voltage Vin2 can be applied to the input terminal $V_{IN3N}$ and the input terminal $V_{IN3P}$, respectively, so as to output a positive voltage. This circuit configuration is an example of a method for realizing the differential-to-single-end conversion, and may be configured by another circuit having a similar function.

As described above, the signal transmission system according to the sixth embodiment is a signal transmission system that includes a first signal transmission device (for example, the electronic device 1-1 of FIG. 9) having a configuration of the signal transmission device according to the fifth embodiment described above and a second signal transmission device (for example, the electronic device 1-2 of FIG. 9) that communicates with the first signal transmission device via a cable (twisted pair cable 8). The second signal transmission device includes a third signal wiring (P-side signal wiring 6-1) that is connected via the cable to a first signal wiring (P-side signal wiring 6-2) to which a first applied voltage of the first signal transmission device is applied, a fourth signal wiring (N-side signal wiring 7-1) that is connected via the cable to a second signal wiring (N-side signal wiring 7-2) to which a second applied voltage of the first signal transmission device is applied, and a voltage conversion circuit (differential-to-single-end conversion circuit 46) that converts positive and negative differential voltages applied via the third signal wiring and the fourth signal wiring into a ground reference voltage.

In the present embodiment configured as described above, in the signal transmission device (the electronic device 1-1 in FIG. 9) of the communication partner of the signal transmission device (the electronic device 1-2 in FIG. 9) according to the fifth embodiment, the reception power is input to the power supply circuit via the differential-to-single-end conversion circuit on the power reception side. Accordingly, according to the present embodiment, even in a case where the signal transmission device according to the fifth embodiment is used, the signal transmission system can be established as a power supply system.

Seventh Embodiment

Figure 11:
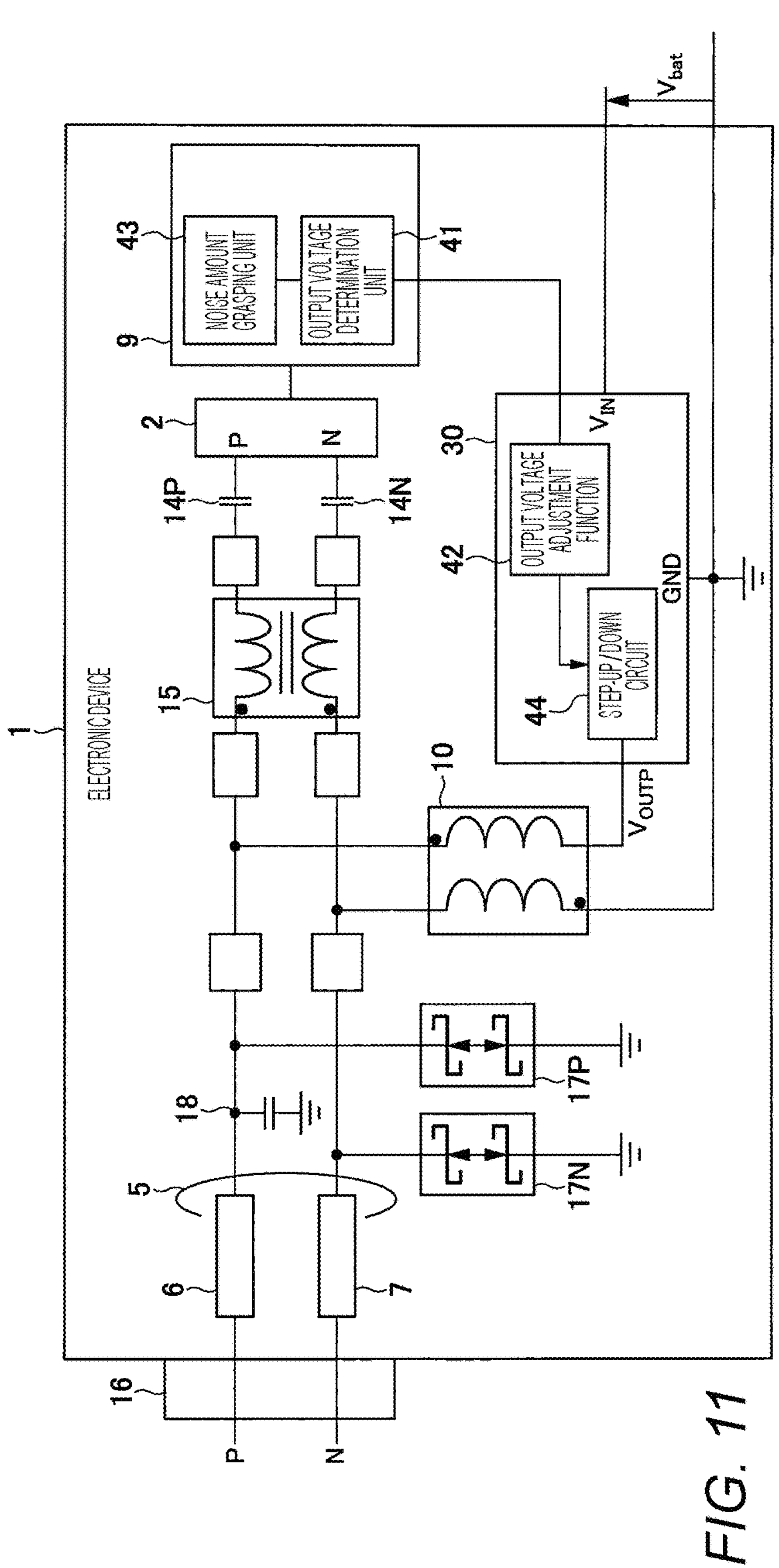
FIG. 11 is a diagram illustrating a configuration example of an electronic device to which a signal transmission device according to a seventh embodiment of the present invention is applied.

FIG. 11 is a diagram illustrating a configuration example of an electronic device to which a signal transmission device according to a seventh embodiment of the present invention is applied.

In the seventh embodiment, the power supply circuit 30 is provided with the step-up/down circuit 44 connected to the output terminal $V_{OUTP}$ connected to the P-side terminal of the power supply superimposing filter 10, the N-side terminal of the power supply superimposing filter 10 is connected to the ground terminal GND, and only the P-side output voltage is adjusted by the output voltage adjustment function 42. That is, in the present embodiment, the output voltage is adjusted by the potential only on the P side, so that there is little room for adjustment of the voltage change, but an inexpensive device can be utilized for the power supply circuit 30 itself, so that the configuration is low cost. However, since a high bias voltage is always applied to the P side, the parasitic capacitance of the electrostatic protection element 17P tends to be smaller than that of the electrostatic protection element 17N.

In this regard, a feature of the configuration according to the present embodiment is that a capacitive load mechanism 18 corresponding to the difference between the parasitic capacitances is configured on a printed wiring board. Note that the capacitive load mechanism can also be configured as a board pattern of a printed wiring board. That is, in a case where a ground layer is present in the second layer of the printed wiring board, if an additional electrode structure of a certain size is formed in the top layer, a capacitance can be formed by a parallel flat plate. Here, since the value of the capacitance to be adjusted is a small capacitance of 100 fF or less, in the formation size of the board pattern, a structure can be small, on the order of square millimeters. Note that the configuration method of the capacitive load mechanism may be other methods as long as the capacitive load can be formed.

As described above, in the signal transmission device (electronic device 1) according to the seventh embodiment, only the parameter related to the first applied voltage (P side) of the voltage output circuit can be adjusted by the output voltage adjustment function (output voltage adjustment function 42) of the power supply circuit, and the potential of the second signal wiring (N-side signal wiring 7) is connected to the ground.

According to the signal transmission device having the above configuration according to the present embodiment, the output voltage of the power supply circuit is adjusted only on the P side, and the adjustment of the output voltage on the N side is omitted, so that noise can be reduced with a low-cost configuration. In addition, since only one channel of the output of the power supply circuit 30 (power supply IC) is used, a lower cost configuration can be realized.

Here, in the present embodiment, the first applied voltage applied to the first signal wiring (P-side signal wiring 6) is higher than the second applied voltage applied to the second signal wiring (N-side signal wiring 7). Then, the capacitive load mechanism (capacitive load mechanism 18) corresponding to a difference in parasitic capacitance between the first electronic component (for example, the electrostatic protection element 17P) and the second electronic component (for example, the electrostatic protection element 17N) is formed on the first signal wiring on the printed wiring board.

In the present embodiment configured as described above, the noise of the differential transmission path can be reduced with a low-cost configuration by adding the capacitive load mechanism to the printed wiring board.

Eighth Embodiment

Figure 12:
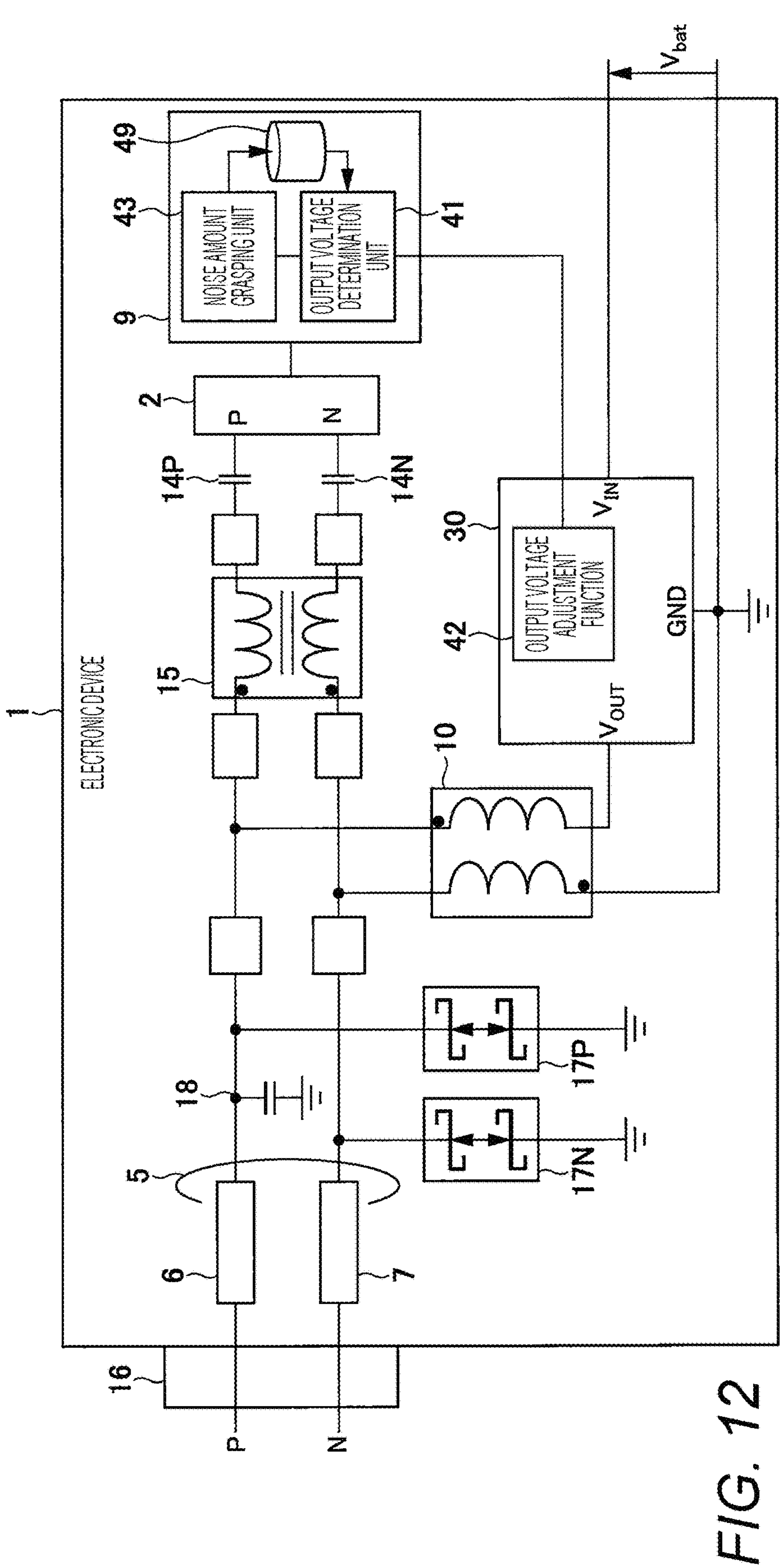
FIG. 12 is a diagram illustrating a configuration example of an electronic device to which a signal transmission device according to an eighth embodiment of the present invention is applied.

FIG. 12 is a diagram illustrating a configuration example of an electronic device to which a signal transmission device according to an eighth embodiment of the present invention is applied.

The eighth embodiment is the invention in which a noise amount-bias voltage relationship data storage unit 49 is provided in the information processing LSI 9, and a function capable of grasping, by the noise amount grasping unit 43, the noise amount of the target signal transmission system when adjusted to the output voltage determined by the output voltage determination unit 41, and storing, as data, a relationship between the set voltage of the output voltage (bias voltage) and the noise amount is incorporated.

Note that a non-volatile memory such as a flash memory can be used as the noise amount-bias voltage relationship data storage unit 49. Alternatively, a volatile memory such as a DRAM may be used as the noise amount-bias voltage relationship data storage unit 49, and the noise amount-bias voltage relationship data may be uploaded to a server outside the vehicle that can communicate with the electronic device 1. In addition, the upload destination of this data is not limited to the server, and may be a non-volatile memory (not illustrated) in the host vehicle. The noise amount-bias voltage relationship data can be managed by the host vehicle by using the non-volatile memory in the host vehicle as the storage location of this data.

As described above, the signal transmission device (electronic device 1) according to the eighth embodiment includes a storage unit (for example, the noise amount-bias voltage relationship data storage unit 49) that stores, as correlation data, a relationship between a noise amount of the differential wiring grasped by the noise amount grasping unit (noise amount grasping unit 43) and a set voltage when communication is performed in a state where at least one voltage of the first applied voltage (P-side signal wiring 6) or the second applied voltage (N-side signal wiring 7) is set. Then, the output voltage determination unit (output voltage determination unit 41) determines the instruction value (DC bias voltage) of at least one of the first applied voltage or the second applied voltage on the basis of a relationship between the noise amount of the differential wiring and the set voltage.

According to the signal transmission device of the present embodiment having the above configuration, when the relationship data between the noise amount and the set voltage is stored in the storage unit, the output voltage determination unit can call the relationship between the noise amount and the voltage setting and select an appropriate voltage value of the bias voltage according to the situation of the differential transmission path.

Ninth Embodiment

Figure 13:
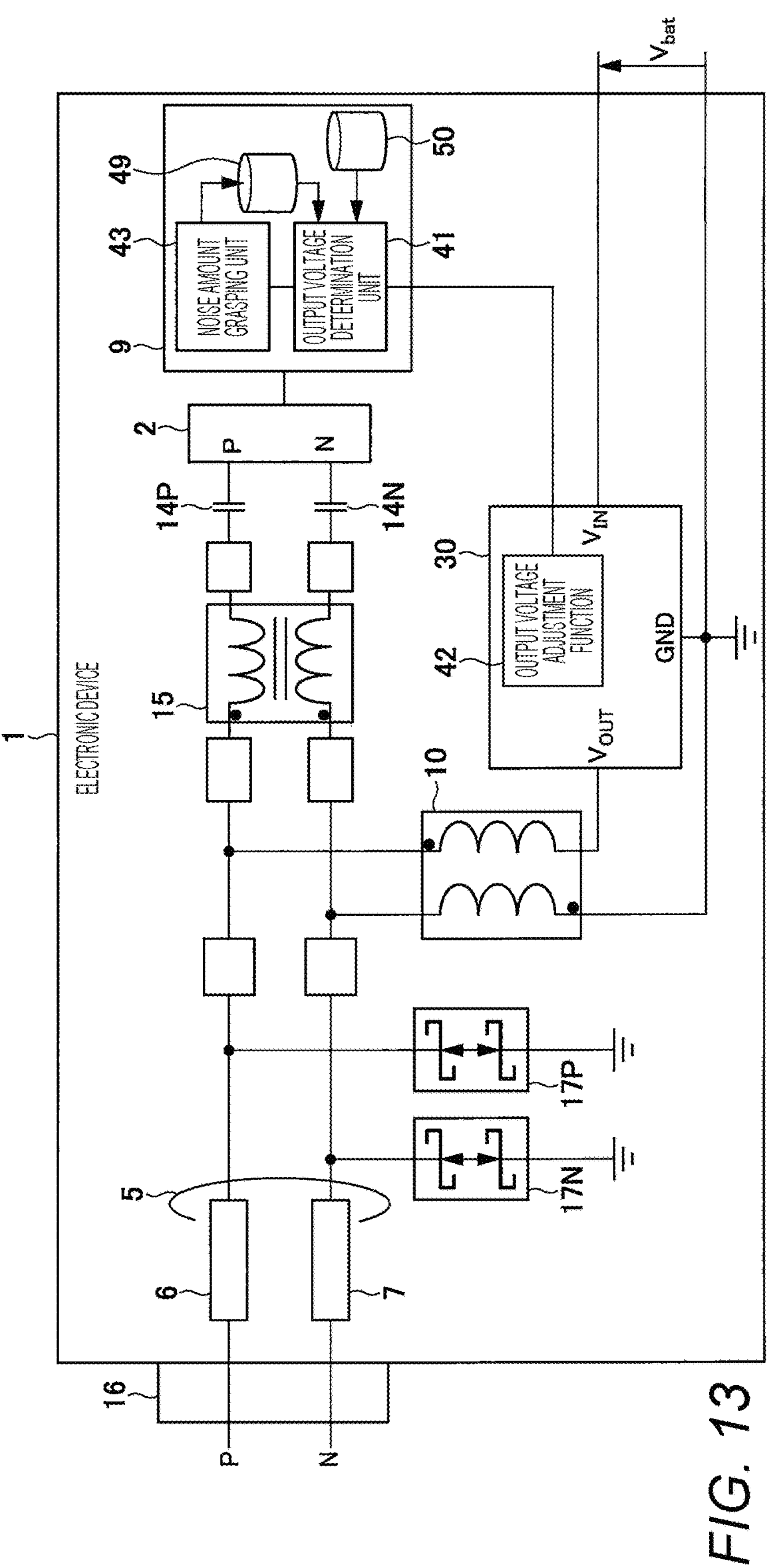
FIG. 13 is a diagram illustrating a configuration example of an electronic device to which a signal transmission device according to a ninth embodiment of the present invention is applied.

FIG. 13 is a diagram illustrating a configuration example of an electronic device to which a signal transmission device according to a ninth embodiment of the present invention is applied.

The ninth embodiment is the invention in which, in addition to the configuration of the eighth embodiment, a signal quality criterion storage unit 50 is provided in the information processing LSI 9, and a function capable of searching for a voltage of a condition satisfying the signal quality criterion from the data of the noise amount-bias voltage relationship data storage unit 49 and defining a settable voltage range is incorporated. Here, the signal quality criterion is information of an allowable noise amount of the differential transmission path (for example, the differential wiring 5). Details of the processing using the signal quality criterion storage unit 50 will be described in a tenth embodiment of the present invention.

Note that, similarly to the noise amount-bias voltage relationship data storage unit 49, a non-volatile memory or a volatile memory can be used as the signal quality criterion storage unit 50. That is, the signal quality criterion may be managed by the host vehicle by using the non-volatile memory in the host vehicle, or the signal quality criterion may be uploaded or downloaded to a server or the like outside the electronic device 1.

As described above, the signal transmission device (electronic device 1) according to the ninth embodiment includes the storage unit (for example, the signal quality criterion storage unit 50) that stores information on the allowable noise amount of the differential wiring. The output voltage determination unit (output voltage determination unit 41) determines an instruction value (bias voltage) of at least one of the first applied voltage (P-side signal wiring 6) or the second applied voltage (N-side signal wiring 7), on the basis of the relationship between the noise amount of the differential wiring and the set voltage as well as the allowable noise amount.

According to the signal transmission device having the above configuration according to the present embodiment, the voltage value of the bias voltage that satisfies the signal quality can be determined from the relationship between the noise amount-bias voltage relationship data and the signal quality criterion.

Tenth Embodiment

Figure 14:
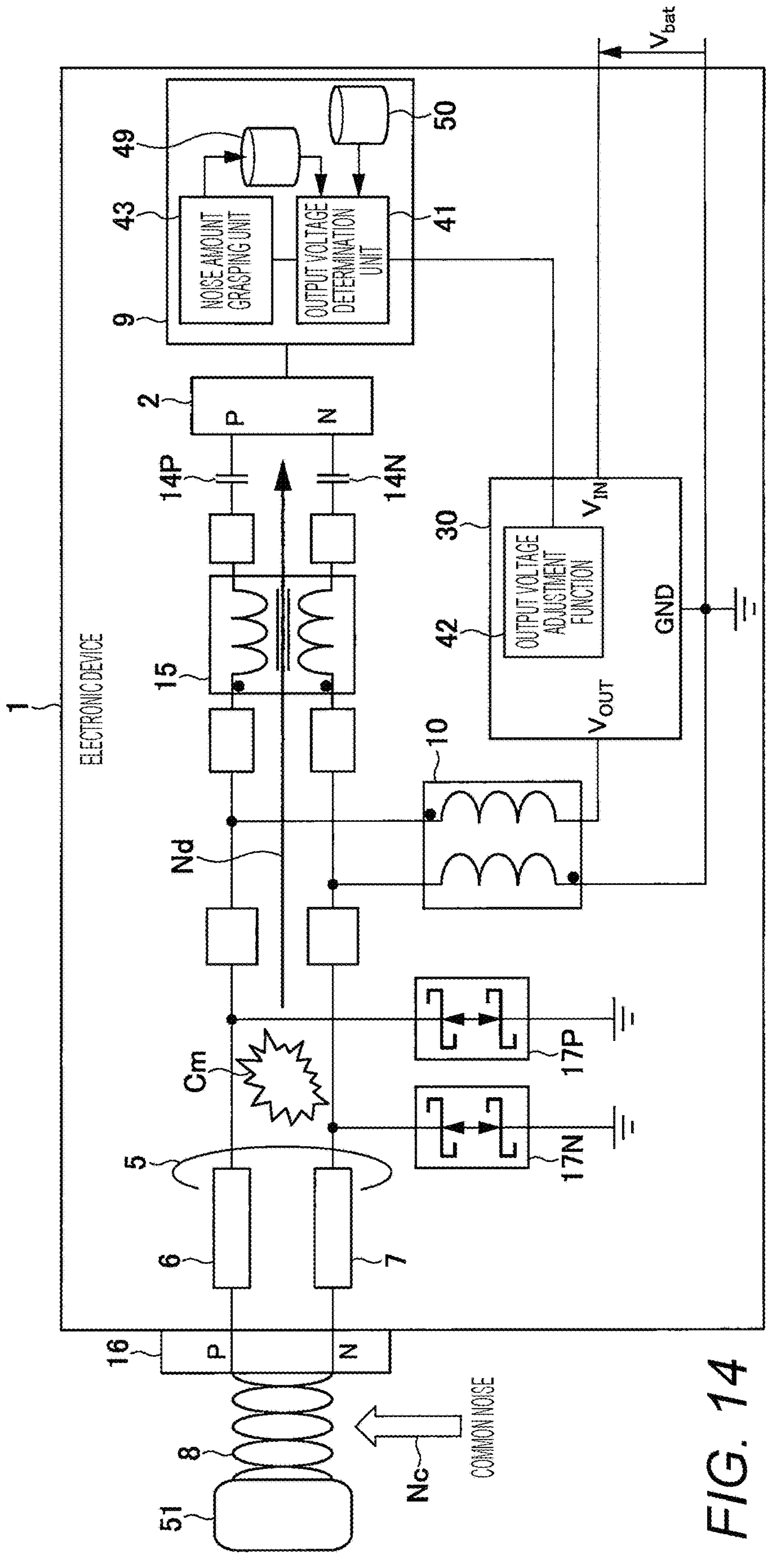
FIG. 14 is a diagram illustrating an example of a process of determining an output voltage range in a signal transmission system using an electronic device to which a signal transmission device according to a tenth embodiment of the present invention is applied.

FIG. 14 is a diagram illustrating an example of a process of determining an output voltage range in a signal transmission system using an electronic device to which a signal transmission device according to the tenth embodiment of the present invention is applied.

In the tenth embodiment, the invention will be described which relates to a process of determining the output voltage range at the time of product shipment or at the time of inspection such as legal vehicle inspection.

In the present embodiment, a reference counterpart 51 is connected to the electronic device 1 via the twisted pair cable 8, and the reference counterpart 51 and the electronic device 1 communicate with each other. The reference counterpart 51 is a standard communication module, and plays a role of relatively evaluating communication performance of the electronic device 1 connected to the communication module.

In this state, a common noise Nc is applied to the twisted pair cable 8. The applied common noise Nc is mixed into the electronic device 1 via the cable connector 16. Then, the common noise Nc is converted into a differential noise Nd in accordance with the characteristics of the mode conversion loss in the vicinity of the electrostatic protection elements 17N and 17P (mode conversion Cm), and is transmitted to the communication LSI 2. The differential noise Nd converted from the common noise Nc increases or decreases according to the output voltage of the power supply circuit 30. By measuring the differential noise Nd transmitted to the communication LSI 2 by the noise amount grasping unit 43 in the information processing LSI 9, it is possible to evaluate the noise performance of the current communication system.

As described above, the signal transmission system according to the tenth embodiment includes the second signal transmission device (the reference counterpart 51 in FIG. 14) facing the first signal transmission device (for example, the electronic device 1 of FIGS. 13 and 14) to which the signal transmission device according to the above-described embodiment is applied, and the first signal transmission device and the second signal transmission device are connected by the cable (twisted pair cable 8). The common noise is applied to the cable, the noise amount is measured by the noise amount grasping unit (noise amount grasping unit 43) of the information processing LSI 9, and the relationship between the noise amount and the set voltage is quantified.

Next, the process of determining the output voltage range will be described in more detail together with the graph of FIG. 15 and the flowchart of FIG. 16.

Figure 15:
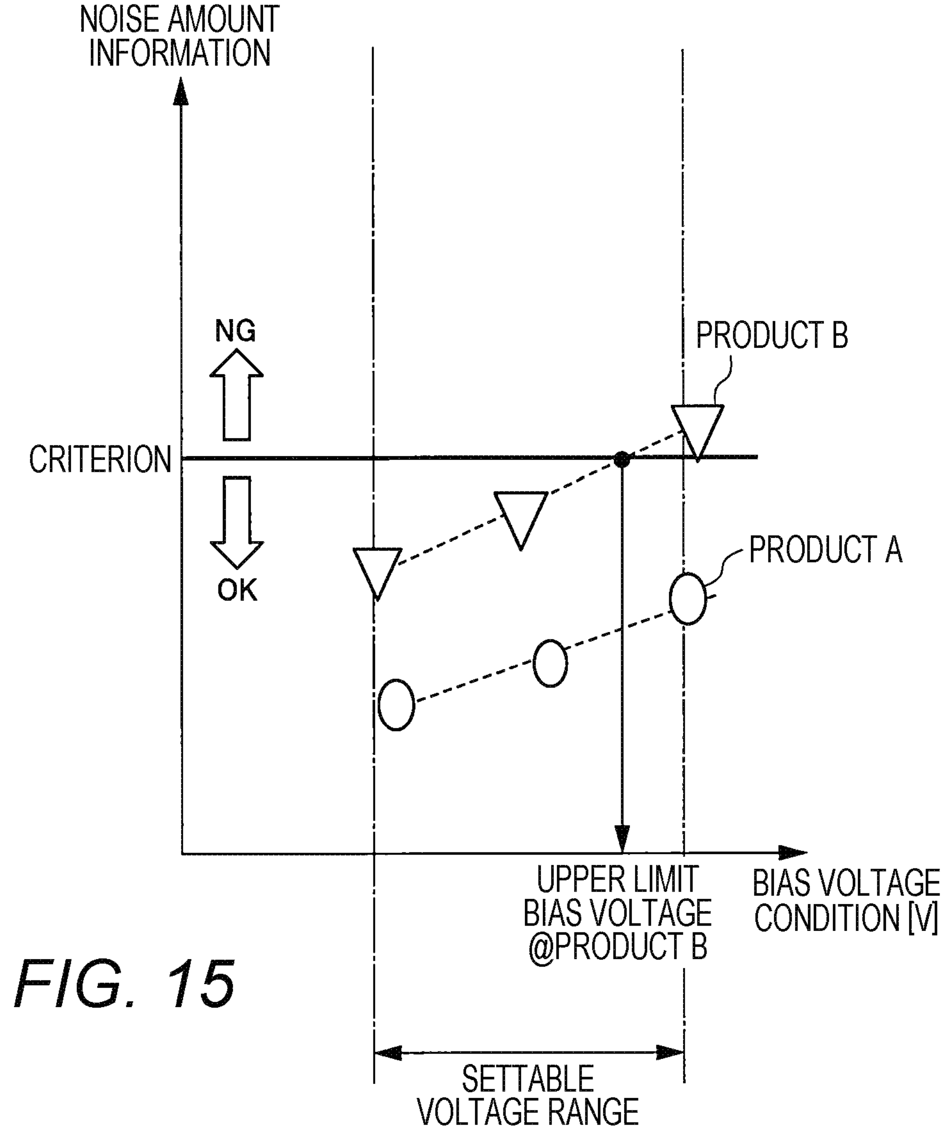
FIG. 15 is a diagram illustrating an example of a data set obtained by using the signal transmission device according to the tenth embodiment of the present invention.

FIG. 15 is a diagram illustrating an example of a data set obtained by using the signal transmission device according to the tenth embodiment of the present invention. In FIG. 15, a horizontal axis represents the bias voltage condition [V], and a vertical axis represents the noise amount information.

Figure 16:
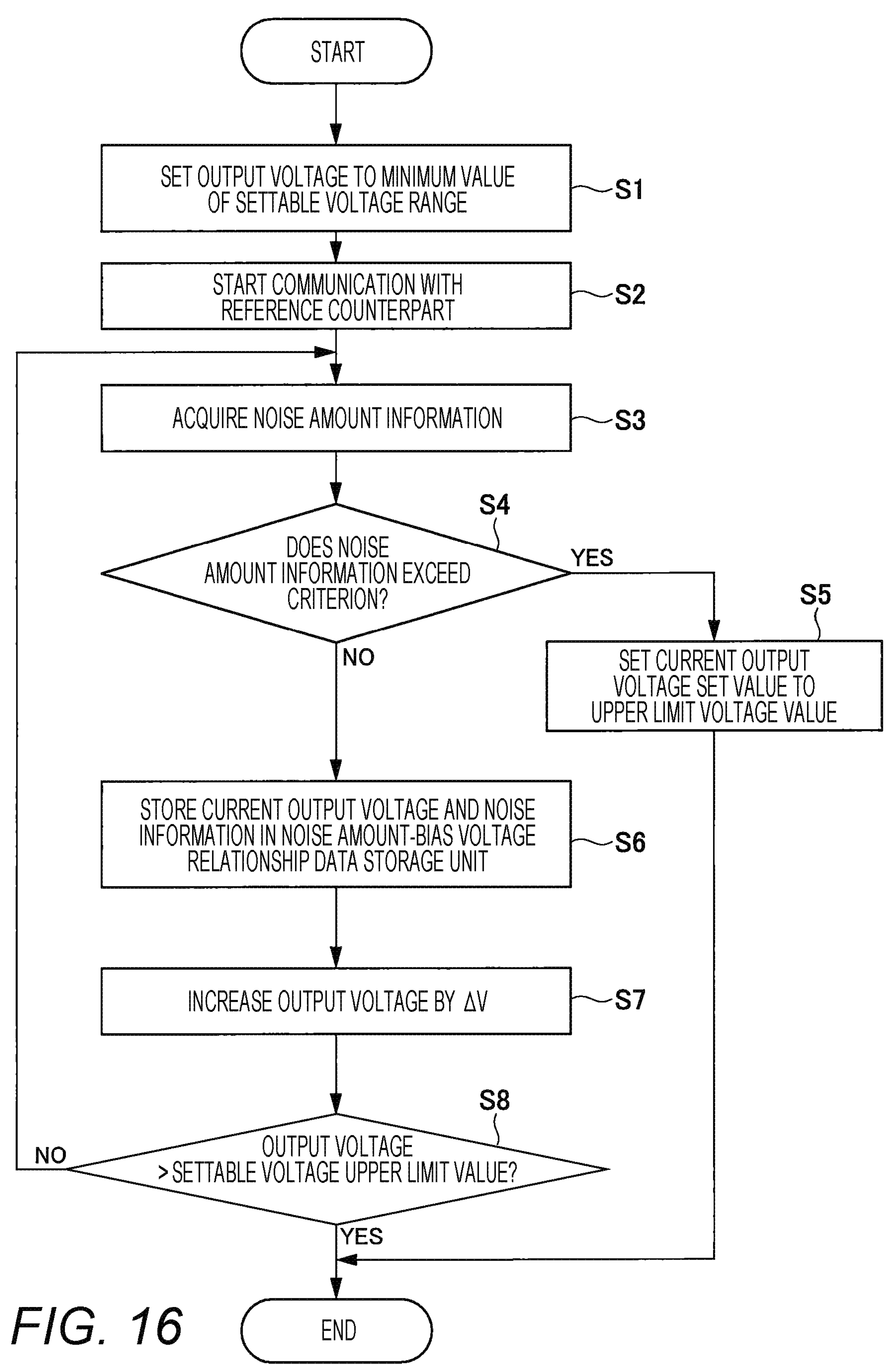
FIG. 16 is a flowchart illustrating a procedure example of a noise amount-bias voltage relationship data acquisition process in the electronic device to which the signal transmission device according to the tenth embodiment of the present invention is applied.

FIG. 16 is a flowchart illustrating a procedure example of a noise amount-bias voltage relationship data acquisition process in the electronic device to which the signal transmission device according to the tenth embodiment of the present invention is applied.

The information desired to be finally obtained is a data plot of the relationship between the bias voltage condition and the noise amount information as illustrated in FIG. 15. An example of a procedure for obtaining the information will be described with reference to the flowchart of FIG. 16. Note that the name of each component used in the description of each process in this flowchart refers to FIG. 14 unless otherwise specified.

First, in the electronic device 1, the output voltage determination unit 41 of the information processing LSI 9 sets the output voltage of the P-side output terminal $V_{OUT}$ in the power supply circuit 30 to the minimum value of the settable voltage range by using the output voltage adjustment function 42 (step S1).

Next, communication is started between the electronic device 1 and the reference counterpart 51 (step S2). In this state, the noise amount grasping unit 43 of the information processing LSI 9 acquires information on the noise amount under the bias voltage condition (hereinafter, "noise amount information") (step S3).

Next, the output voltage determination unit 41 compares the noise amount information acquired here with the criterion (allowable noise amount) stored in the signal quality criterion storage unit 50, and determines whether the noise amount information exceeds the criterion (step S4).

If the noise amount information exceeds the criterion (YES in step S4), the output voltage determination unit 41 sets the output voltage set value at that time to an upper limit voltage value (step S5). After the process of step S5, this process ends.

On the other hand, if the noise amount information is the criterion or less (NO in step S4), the output voltage determination unit 41 stores the current output voltage and the noise amount information in the noise amount-bias voltage relationship data storage unit 49 (step S6).

Next, the output voltage determination unit 41 increases the output voltage by ΔV and outputs the voltage increased by ΔV by using the output voltage adjustment function 42 of the power supply circuit 30 (step S7).

Here, the output voltage determination unit 41 compares the output voltage with a settable voltage upper limit value (step S8). If the output voltage exceeds the settable voltage upper limit value (YES in step S8), the process ends here. In addition, if the output voltage is less than or equal to the settable voltage upper limit value (NO in step S8), the process returns to step S3, and the operations in steps S3 to S8 are repeatedly performed.

By repeating the processing of steps S1 to S8, it is possible to finally obtain the relationship data between the noise amount information and the bias voltage illustrated in FIG. 15. Here, two types of data sets of a product A and a product B are illustrated. In the product A, the noise amount information falls below the criterion under any bias voltage condition in the settable voltage range, and it is determined that there is no problem (OK). In this case, an arbitrary voltage value can be selected as the bias voltage in the product A. On the other hand, in the product B, the noise amount information exceeds the criterion (NG) when exceeding the bias voltage condition of the upper limit bias voltage @product B. Therefore, under this bias voltage condition, in the product B, the settable voltage is determined to be a voltage equal to or lower than the upper limit bias voltage @product B.

In addition, in the signal transmission system according to the tenth embodiment, the common noise is applied to a cable (twisted pair cable 8) connecting two signal transmission devices, the noise amount is measured by the noise amount grasping unit 43 of the information processing LSI 9, and the relationship between the noise amount and the set voltage is quantified. Then, the output voltage determination unit 41 can determine the settable voltage range from the relationship between the noise amount and the set voltage as well as the noise criterion.

Note that, in this example, for the sake of clarity, an example has been described in which the output voltage is adjusted only on the P side. However, actually, the settable voltage in combination of the output voltages on the P side and the N side can be determined by obtaining a similar correlation in combination of the output voltages on the P side and the N side. For example, in a case where the potential difference between the P side and the N side of the differential wiring 5 is +10 V, it is conceivable to set the P side to +12 V and the N side to +2 V when the N side is not inverted, and to set the P side to +8 V and the N side to −2 V when the N side is inverted.

In addition, in the present embodiment, a simple system has been described in which the noise amount increases when the bias voltage is increased, but actually, the relationship between the bias voltage and the noise amount may be determined by a more complicated function. This is because a noise resonance frequency changes or a relationship between the noise frequency and the noise sensitivity of the device is complicated. Therefore, actually, rather than determining the upper limit bias voltage, it is more practical to find a bias voltage condition that satisfies the criterion while changing the value of the bias voltage one way and set only the bias voltage condition as the settable voltage.

Eleventh Embodiment

Figure 17:
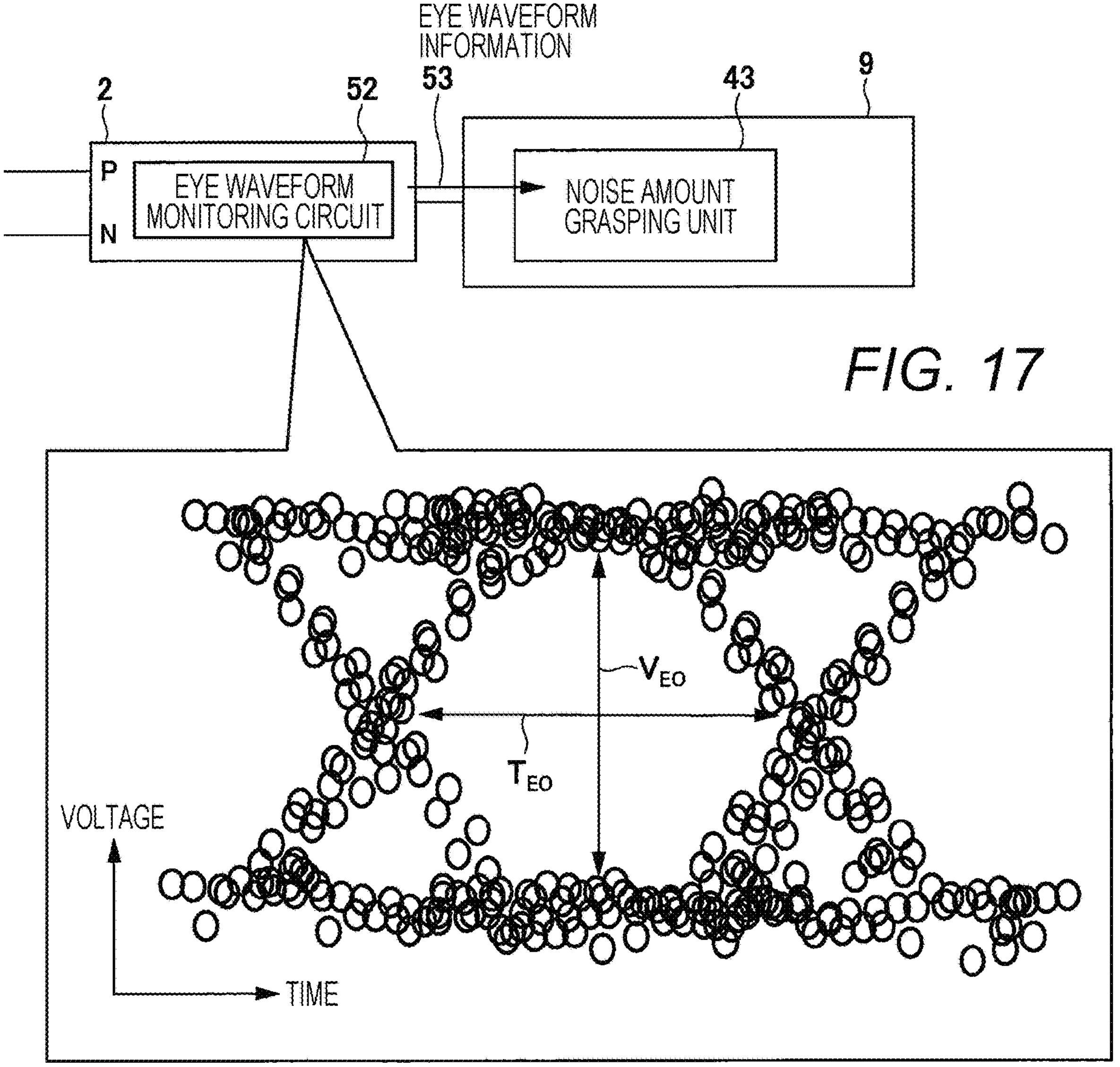
FIG. 17 is a diagram illustrating a configuration example and a function for grasping a noise amount by a noise amount grasping unit of an electronic device to which a signal transmission device according to an eleventh embodiment of the present invention is applied.

FIG. 17 is a diagram illustrating a configuration example and a function for grasping a noise amount by a noise amount grasping unit of an electronic device to which a signal transmission device according to the eleventh embodiment of the present invention is applied.

In the eleventh embodiment, an example of a method of grasping the noise amount by the noise amount grasping unit 43 in the information processing LSI 9 will be described. Here, a method using an eye waveform monitoring circuit 52 (an example of a signal waveform observation circuit) in the communication LSI 2 will be exemplified.

The eye waveform monitoring circuit 52 divides a signal waveform at the time of signal transmission within a specific time and overwrites a voltage-time relationship of the signal waveform to plot a relationship between the passing time and the voltage, thereby forming an eye pattern as illustrated in the lower side of FIG. 17. The opening degree of the eye pattern serves as a basis for determining the signal quality.

All information of such a plot may be transmitted as the eye waveform information 53 to the information processing LSI 9 to grasp the noise amount, or only information such as an eye opening voltage $V_{EO}$ and an eye opening time $T_{EO}$ among the information of the eye waveform may be extracted and used.

As described above, in the signal transmission device (electronic device 1) according to the twelfth embodiment, the noise amount grasping unit (noise amount grasping unit 43) of the information processing circuit (information processing LSI 9) grasps the noise amount of the differential transmission path by using the observation information of the signal waveform observation circuit (eye waveform monitoring circuit 52) included in the communication circuit (communication LSI 2).

Twelfth Embodiment

Figure 18:
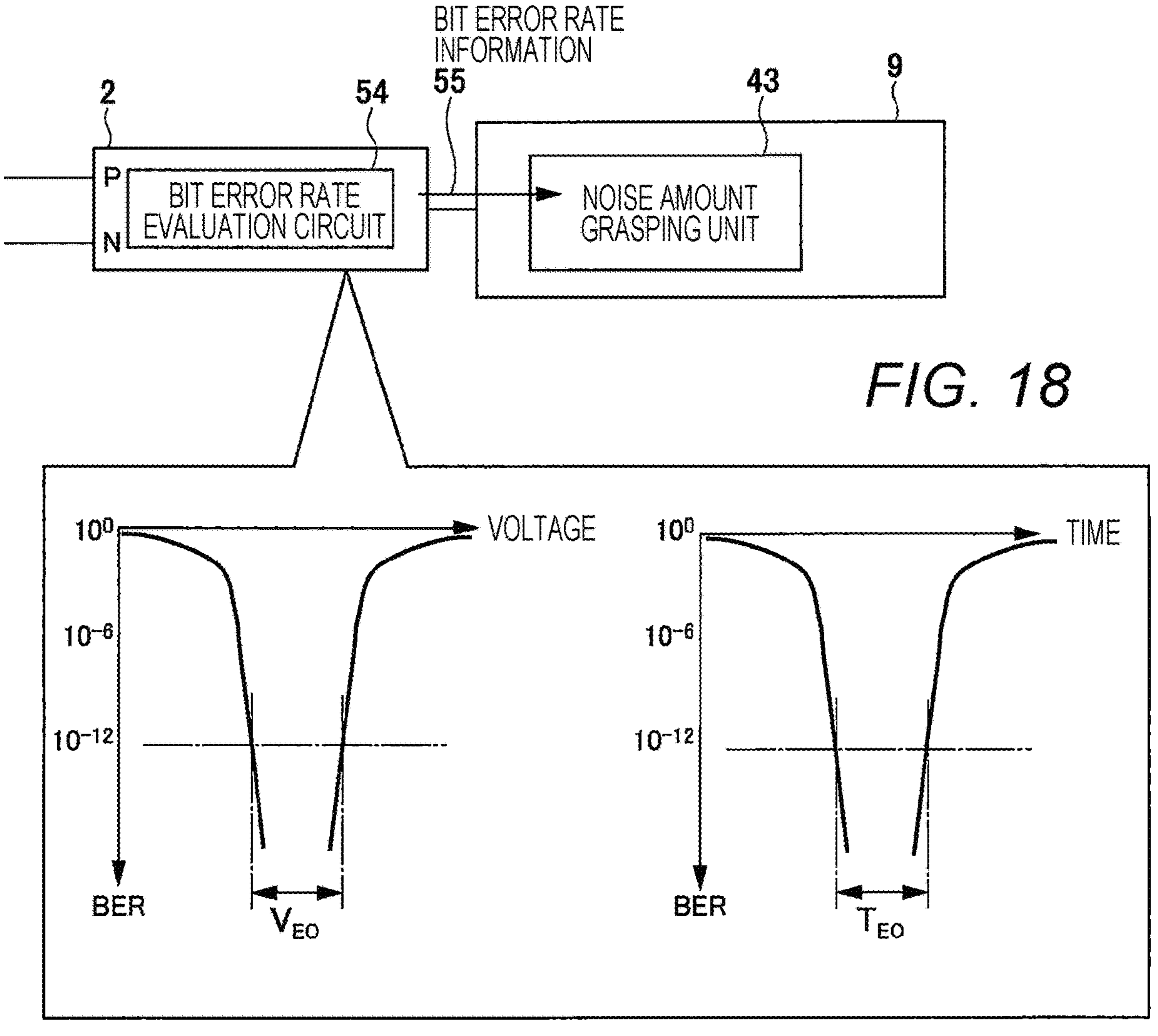
FIG. 18 is a diagram illustrating a configuration example and a function for grasping a noise amount by a noise amount grasping unit of an electronic device to which a signal transmission device according to a twelfth embodiment of the present invention is applied.

FIG. 18 is a diagram illustrating a configuration example and a function for grasping a noise amount by a noise amount grasping unit of an electronic device to which the signal transmission device according to the twelfth embodiment of the present invention is applied.

In the twelfth embodiment, an example different from the eleventh embodiment will be described with respect to the method of grasping the noise amount by the noise amount grasping unit 43 in the information processing LSI 9. Here, a method using a bit error rate evaluation circuit 54 (an example of a communication error rate measurement circuit) in the communication LSI 2 will be exemplified.

The bit error rate evaluation circuit 54 acquires a bathtub curve as illustrated on the lower side of FIG. 18 from a bit error occurrence condition when a signal is transmitted to the differential wiring 5 for a certain period of time. The left graph on the lower side in FIG. 18 is a bathtub curve illustrating a relationship between the bit error rate (BER) and the voltage, and the right graph on the lower side in FIG. 18 is a bathtub curve illustrating a relationship between the bit error rate (BER) and the time. The information of such a bathtub curve may be transmitted as bit error rate information 55 to the information processing LSI 9 to grasp the noise amount, or only information such as the eye opening voltage $V_{EO}$ and the eye opening time $T_{EO}$ at a specific error rate (for example, BER $10^{-12}$ or the like) in the bit error rate information 55 may be extracted and utilized. That is, the values of the eye opening voltage $V_{EO}$ and the eye opening time $T_{EO}$ are different according to the bit error rate. Generally, when the bit error rate is smaller than $10^{-12}$, the communication quality can be maintained.

Note that in addition, the communication LSI 2 may have a function of signal quality evaluation such as a signal quality index (SQI), and the function may be used. If a function capable of evaluating the noise amount or the signal quality is provided as a similar function, it is possible to grasp the noise amount by utilizing them.

As described above, in the signal transmission device (electronic device 1) according to the twelfth embodiment, the noise amount grasping unit (noise amount grasping unit 43) of the information processing circuit (information processing LSI 9) grasps the noise amount of the differential transmission path by using the measurement information of the communication error rate measurement circuit (bit error rate evaluation circuit 54) included in the communication circuit (communication LSI 2).

Thirteenth Embodiment

Figure 19:
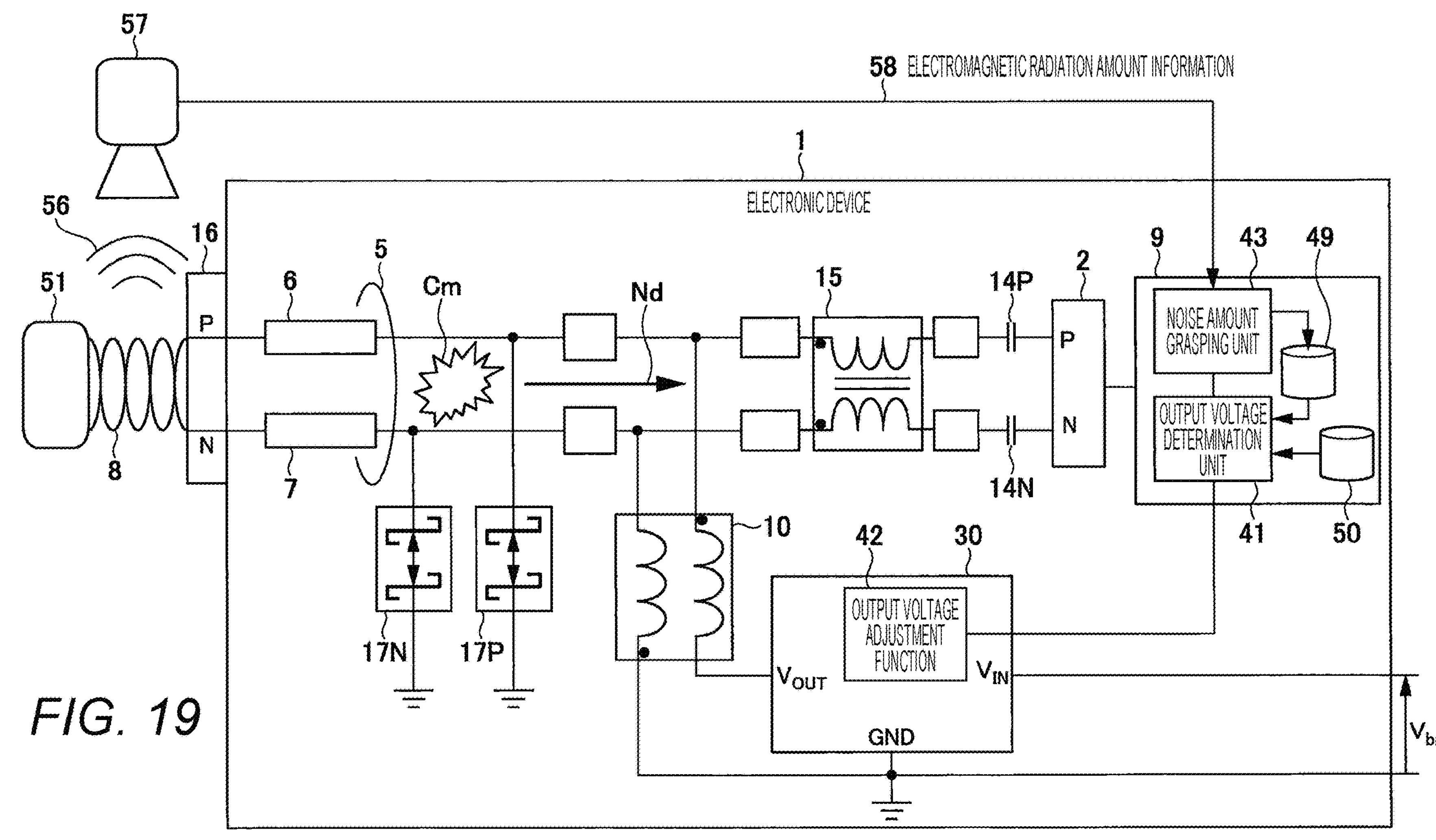
FIG. 19 is a diagram illustrating an example of a process of grasping a noise amount in a signal transmission system using an electronic device to which a signal transmission device according to a thirteenth embodiment of the present invention is applied.

FIG. 19 is a diagram illustrating an example of a process of grasping a noise amount in a signal transmission system using an electronic device to which a signal transmission device according to a thirteenth embodiment of the present invention is applied.

In the thirteenth embodiment, the invention relating to the process of grasping the noise amount from an electromagnetic radiation amount will be described. In the present embodiment, a reference counterpart 51 is connected to the electronic device 1 via the twisted pair cable 8, and the reference counterpart 51 and the electronic device 1 communicate with each other. In this state, electromagnetic radiation 56 corresponding to the common noise amount mode-converted by the electronic device 1 is generated from the twisted pair cable 8. This is measured by an electromagnetic interference (EMI) measuring instrument 57 installed outside the electronic device 1, and electromagnetic radiation amount information 58 obtained by this measurement is transmitted to the noise amount grasping unit 43. Note that this measurement is desirably performed inside an anechoic chamber in order to maintain measurement accuracy.

As described above, the signal transmission system according to the thirteenth embodiment includes the second signal transmission device (the reference counterpart 51 in FIG. 19) facing the first signal transmission device (for example, the electronic device 1 of FIGS. 12 and 13) to which the signal transmission device according to the above-described embodiment is applied, and the first signal transmission device and the second signal transmission device are connected by the cable (twisted pair cable 8). The electromagnetic wave noise radiated from the cable is measured by an external measuring instrument (for example, EMI measuring instrument 57), and the noise amount is calculated from the measurement result by the noise amount grasping unit (noise amount grasping unit 43) of the information processing LSI 9 to quantify the relationship between the noise amount and the set voltage.

Fourteenth Embodiment

Figure 20:
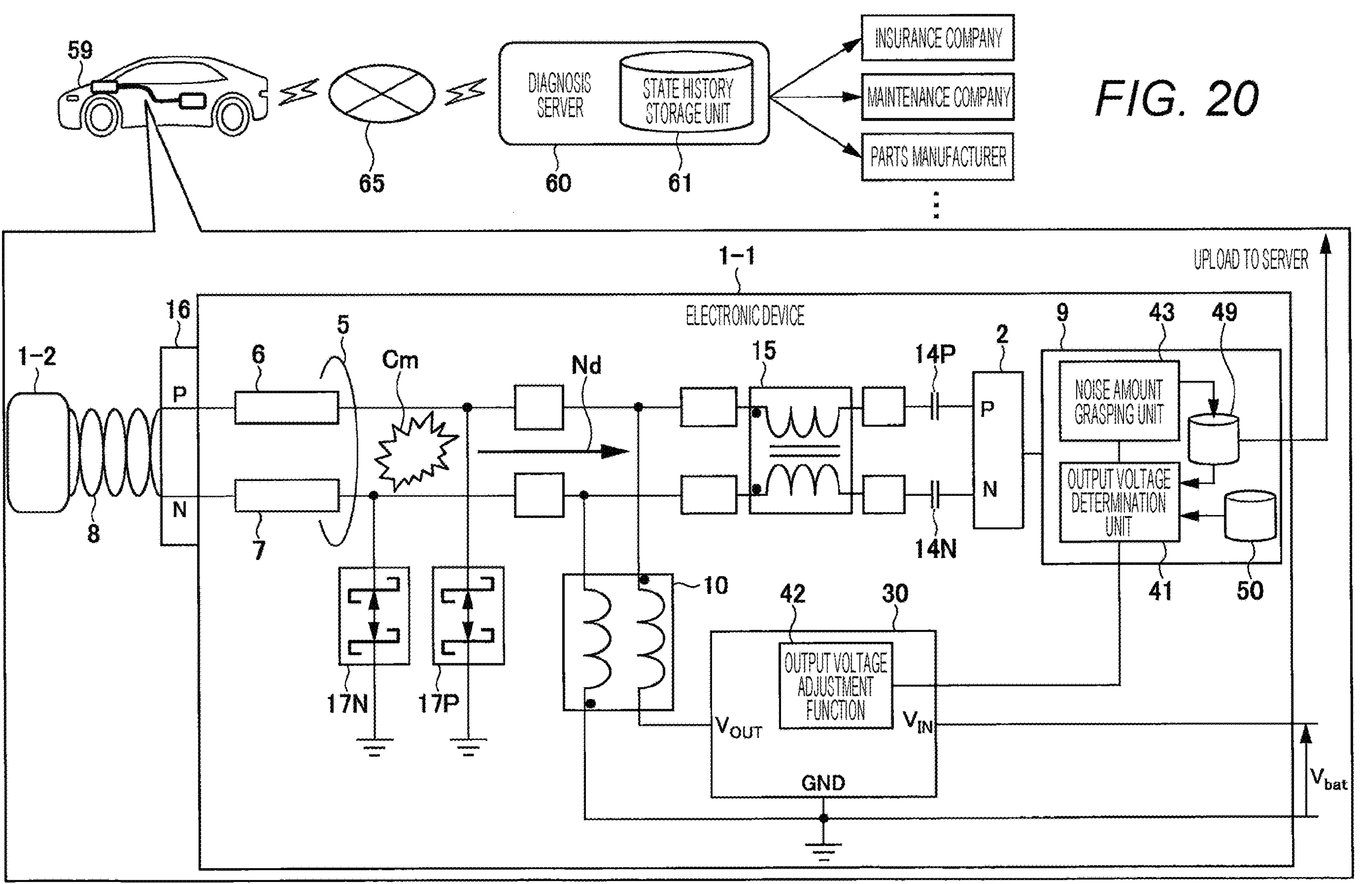
FIG. 20 is a diagram illustrating a configuration example of a solution system including a signal transmission system using an electronic device to which a signal transmission device according to a fourteenth embodiment of the present invention is applied and a diagnosis server.

FIG. 20 is a diagram illustrating a configuration example of a solution system (diagnosis service system) including a signal transmission system using an electronic device to which a signal transmission device according to a fourteenth embodiment of the present invention is applied and a diagnosis server.

In the fourteenth embodiment, a solution will be described in which, in a vehicle 59 such as an automobile in operation, the output voltage range is determined by using the present invention, and the history of the voltage value of the determined output voltage is stored and managed in a state history storage unit 61 in a diagnosis server 60, so that the information is used for various services such as maintenance and insurance.

In the example illustrated in FIG. 20, in the vehicle 59, the electronic device 1-2 is connected to the electronic device 1-1 via the twisted pair cable 8, and both are in a state of communication. In such a state, it is possible to evaluate the current state of the communication system by storing the history of the relationship between the bias voltage condition and the noise amount in time series.

The process of the diagnosis service in the present embodiment will be described in more detail together with the graph of FIG. 21 and the flowchart of FIG. 22.

FIG. 21 is a diagram illustrating an example of a data set obtained by the signal transmission system using the electronic device 1-1 to which the signal transmission device according to the fourteenth embodiment of the present invention is applied and a prediction curve of the upper limit bias voltage [V].

Figure 22:
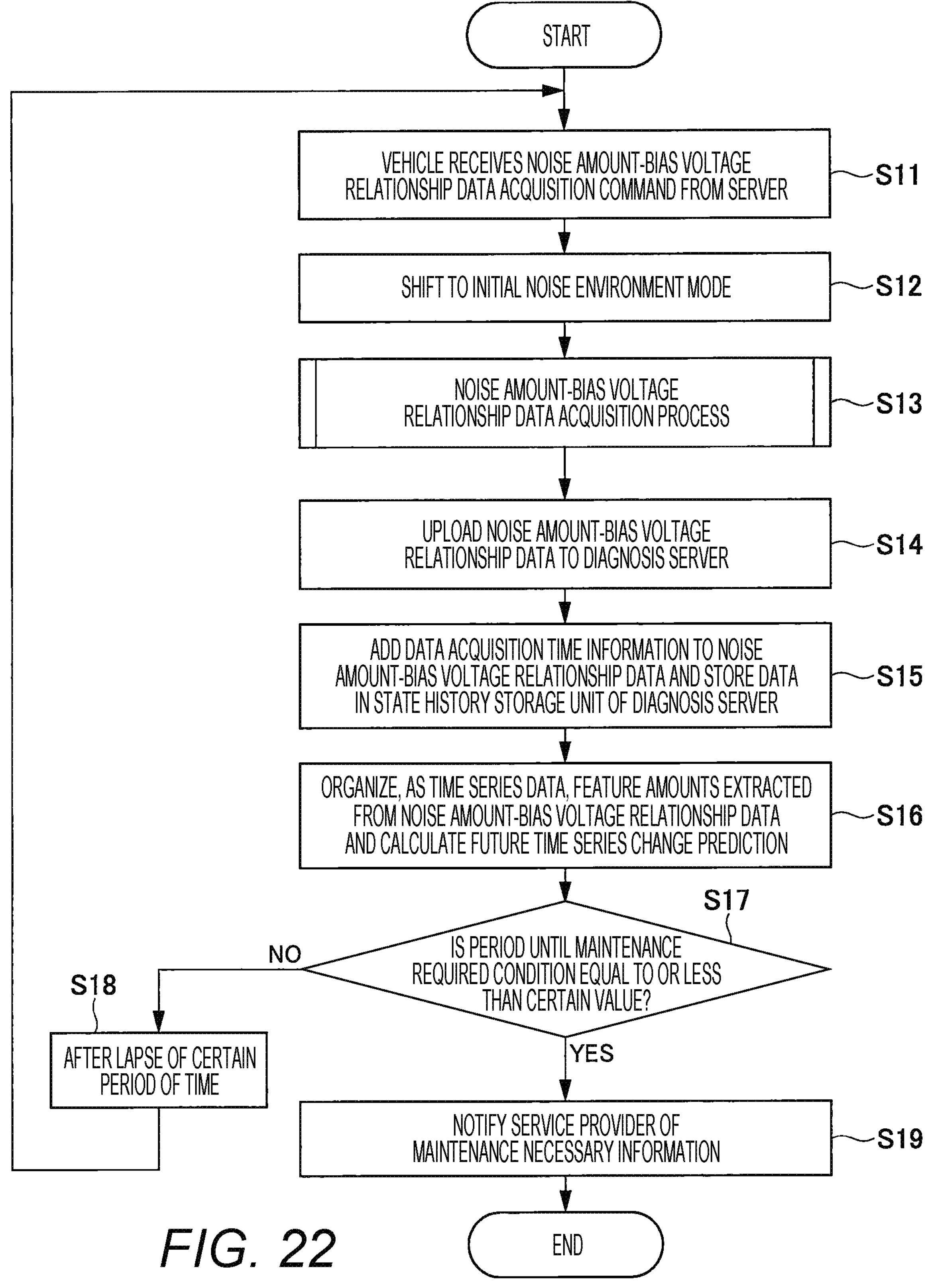
FIG. 22 is a flowchart illustrating a procedure example of a maintenance necessary information notification process by the solution system including the signal transmission system using the electronic device to which the signal transmission device according to the fourteenth embodiment of the present invention is applied and the diagnosis server.

FIG. 22 is a flowchart illustrating a procedure example of maintenance necessary information notification processing by the solution system (diagnosis service system) including the signal transmission system using the electronic device 1-1 to which the signal transmission device according to the fourteenth embodiment of the present invention is applied and the diagnosis server 60.

The information desired to be finally obtained is a data plot of the relationship between the bias voltage condition and the noise amount information as illustrated in FIG. 21. An example of a procedure for obtaining the information will be described with reference to the flowchart of FIG. 22. Note that the name of each component used in the description of each process in this flowchart refers to FIG. 20 unless otherwise specified.

First, the electronic device 1-1 of the vehicle 59 receives a noise amount-bias voltage relationship data acquisition command from the diagnosis server 60 via a network 65 such as the Internet (step S11).

Thereafter, the electronic device 1-1 of the vehicle 59 performs control to shift the vehicle 59 to an initial noise environment mode so as to achieve a constant noise environment (step S12). The initial noise environment mode of the vehicle means that a main common noise factor (for example, an electric motor control and the operation of an electric system such as an air conditioner) is shifted to a predetermined operation mode so that an external common noise has the same condition, and the noise environment is stabilized.

In this state, the electronic device 1-1 (output voltage determination unit 41) of the vehicle 59 acquires the noise amount-bias voltage relationship data according to "the procedure of the noise amount-bias voltage relationship data acquisition process" (FIG. 16) defined in the tenth embodiment (step S13).

Here, the electronic device 1-1 of the vehicle 59 uploads the acquired noise amount-bias voltage relationship data to the diagnosis server 60 (step S14).

Next, the diagnosis server 60 adds data acquisition time information to the uploaded noise amount-bias voltage relationship data and stores the data in the state history storage unit 61 (step S15). Note that at the same time, the diagnosis server 60 also stores the information of the vehicle 59 that is the source of the data acquired this time. The information of the vehicle 59 includes, for example, a vehicle ID. A data set of noise amount-bias voltage relationship data in the specific vehicle is created. An example of this data set is shown in the upper graph of FIG. 21. In the upper graph of FIG. 21, a horizontal axis represents the bias voltage condition [V], and a vertical axis represents the noise amount information. Here, a correlation data set of a certain vehicle A obtained in a period of 2021/10/5 to 2021/12/5 is shown.

The diagnosis server 60 organizes, as time series data, the feature amounts extracted from the data set of the noise amount-bias voltage relationship data and calculates future time series change prediction (step S16). An example of the time series change prediction is illustrated in a lower graph of FIG. 21. In the lower graph of FIG. 21, a horizontal axis represents the test date of the communication test, and a vertical axis represents the upper limit bias voltage [V]. Here, a prediction curve 62 of the upper limit bias voltage based on the data set of the certain vehicle A is illustrated.

Next, the diagnosis server 60 determines whether a period until the maintenance required condition is equal to or less than a certain value in the result of the prediction calculation (step S17).

If it is determined in step S17 that the period until the maintenance required condition exceeds the certain value (NO in step S17), the diagnosis server 60 determines that there is no problem in the state of the communication system. Then, the diagnosis server 60 commands the electronic device 1-1 of the vehicle 59 to perform the data acquisition process of step S11 again after lapse of a certain period of time (step S18).

On the other hand, if it is determined in step S17 that the period until the maintenance required condition is equal to or less than the certain value (YES in step S17), the diagnosis server 60 notifies an appropriate service provider of information necessary for the maintenance (hereinafter referred to as "maintenance necessary information") (step S19). After the process of step S19, this process ends.

For example, by notifying a maintenance company of the maintenance necessary information, the maintenance company notifies the user of the maintenance necessary information. In addition, by notifying an insurance company of the maintenance necessary information, the insurance company can take a measure to raise an insurance fee in a case where a period in which an appropriate maintenance is not performed is extended. In addition, by notifying a parts company of the maintenance necessary information, it is also possible to inform the parts company of the component that requires maintenance.

As described above, the solution system (diagnosis service system) according to the fourteenth embodiment is a system including, for example, the first signal transmission device (electronic device 1-1) having the configuration of the signal transmission device according to the above-described embodiments and the second signal transmission device (electronic device 1-2) that communicates with the first signal transmission device via the cable (twisted pair cable 8).

Then, the first signal transmission device is mounted on an electronic control unit (ECU) that controls a control target object. The electronic control unit is in operation, and the electronic device 1-1 uploads, to the diagnosis server (diagnosis server 60), data (correlation data) indicating the relationship between the noise amount of the communication system (differential transmission path) and the set voltage. The diagnosis server includes the storage unit (state history storage unit 61) that stores correlation data, a date, and electronic control unit specific information (for example, ID) as a set. The diagnosis server 60 grasps the state of the communication system on the basis of the history of the correlation data and provides necessary information to various service providers. In addition, the diagnosis server estimates the time when maintenance is needed, from the history of the correlation data that is the data of the relationship between the noise amount and the set voltage.

Fifteenth Embodiment

Figure 23:
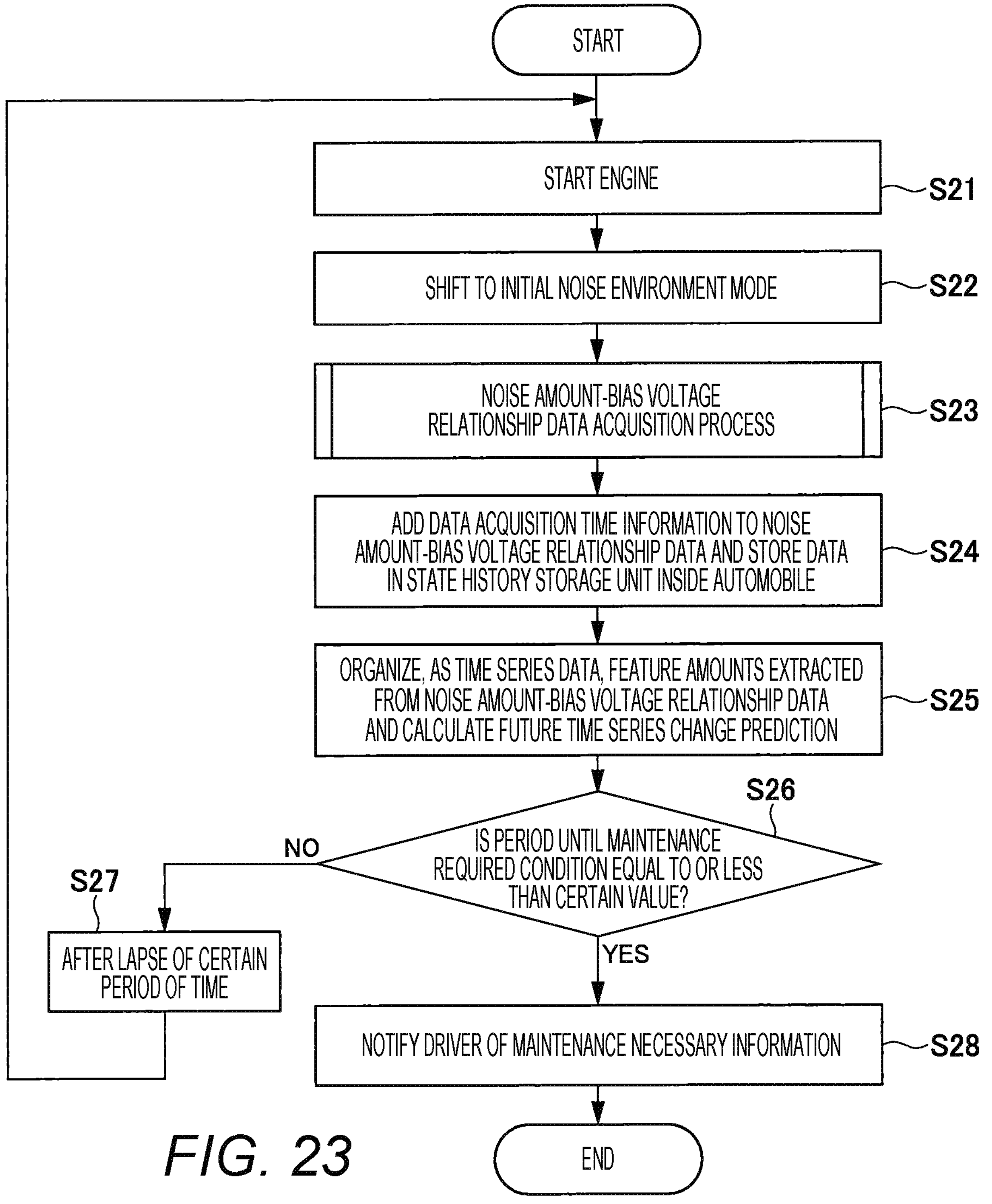
FIG. 23 is a flowchart illustrating another procedure example of the maintenance necessary information notification process by a solution system including a signal transmission system using an electronic device to which a signal transmission device according to a fifteenth embodiment of the present invention is applied.

FIG. 23 is a flowchart illustrating a procedure example of maintenance necessary information notification processing by the solution system (diagnosis service system) including the signal transmission system using the electronic device 1-1 to which the signal transmission device according to the fifteenth embodiment of the present invention is applied.

In the fifteenth embodiment, in the vehicle 59 such as an automobile in operation, an output voltage range is determined by using the present invention, and the state history storage unit 61 is provided in the vehicle 59 to store and manage the history of the voltage value of the determined output voltage, thereby directly indicating the necessity of maintenance to a driver. In the fourteenth embodiment, data management is performed on the diagnosis server 60 side, whereas in the present embodiment, data management is performed only by the vehicle 59. Hereinafter, the procedure of the maintenance necessary information notification will be described in detail with reference to the flowchart of FIG. 23.

First, in the vehicle 59, for example, the electronic device 1-1 starts an engine (step S21).

Thereafter, the electronic device 1-1 of the vehicle 59 performs control to shift the vehicle 59 to the initial noise environment mode so as to achieve a constant noise environment (step S22).

In this state, the electronic device 1-1 (output voltage determination unit 41) of the vehicle 59 acquires the noise amount-bias voltage relationship data according to "the procedure of the noise amount-bias voltage relationship data acquisition process" (FIG. 16) defined in the tenth embodiment (step S23).

Next, the electronic device 1-1 of the vehicle 59 adds data acquisition time information to the acquired noise amount-bias voltage relationship data, and stores the data in the state history storage unit 61 inside the vehicle 59 (step S24).

Next, the electronic device 1-1 of the vehicle 59 organizes, as time series data, the feature amounts extracted from the data set of the noise amount-bias voltage relationship data and calculates future time series change prediction (step S25).

Next, in the result of the above-described prediction calculation, the electronic device 1-1 determines whether a period until the maintenance required condition is equal to or less than a certain value (step S26).

If it is determined in step S26 that the period until the maintenance required condition exceeds the certain value (NO in step S26), the electronic device 1-1 determines that there is no problem in the state of the communication system. Then, the electronic device 1-1 performs the engine start process of step S21 again after lapse of a certain period of time (step S27).

On the other hand, if it is determined in step S26 that the period until the maintenance required condition is equal to or less than the certain value (YES in step S26), the electronic device 1-1 notifies the driver of the maintenance necessary information (step S28). After the process of step S28, this process ends. Note that each process of FIG. 23 described above may be executed by another electronic device instead of the electronic device 1-1.

As described above, the solution system (diagnosis service system) according to the fifteenth embodiment is a system including, for example, the first signal transmission device (electronic device 1-1) having the configuration of the signal transmission device according to the above-described embodiments and the second signal transmission device (electronic device 1-2) that communicates with the first signal transmission device via the cable (twisted pair cable 8).

Then, the first signal transmission device is mounted on an electronic control unit (ECU) that controls a control target object. The electronic control unit is in operation, and the electronic device 1-1 includes the storage unit (that corresponds to the state history storage unit 61 in FIG. 20, for example) that stores data (correlation data) indicating the relationship between the noise amount of the communication system (differential transmission path) and the set voltage and a date as a set. The electronic device 1-1 grasps the state of the communication system on the basis of the history of the correlation data and provides necessary information to the driver. In addition, the electronic device 1-1 estimates the time when maintenance is needed, from the history of the correlation data that is the data of the relationship between the noise amount and the set voltage.

Sixteenth Embodiment

Figure 24:
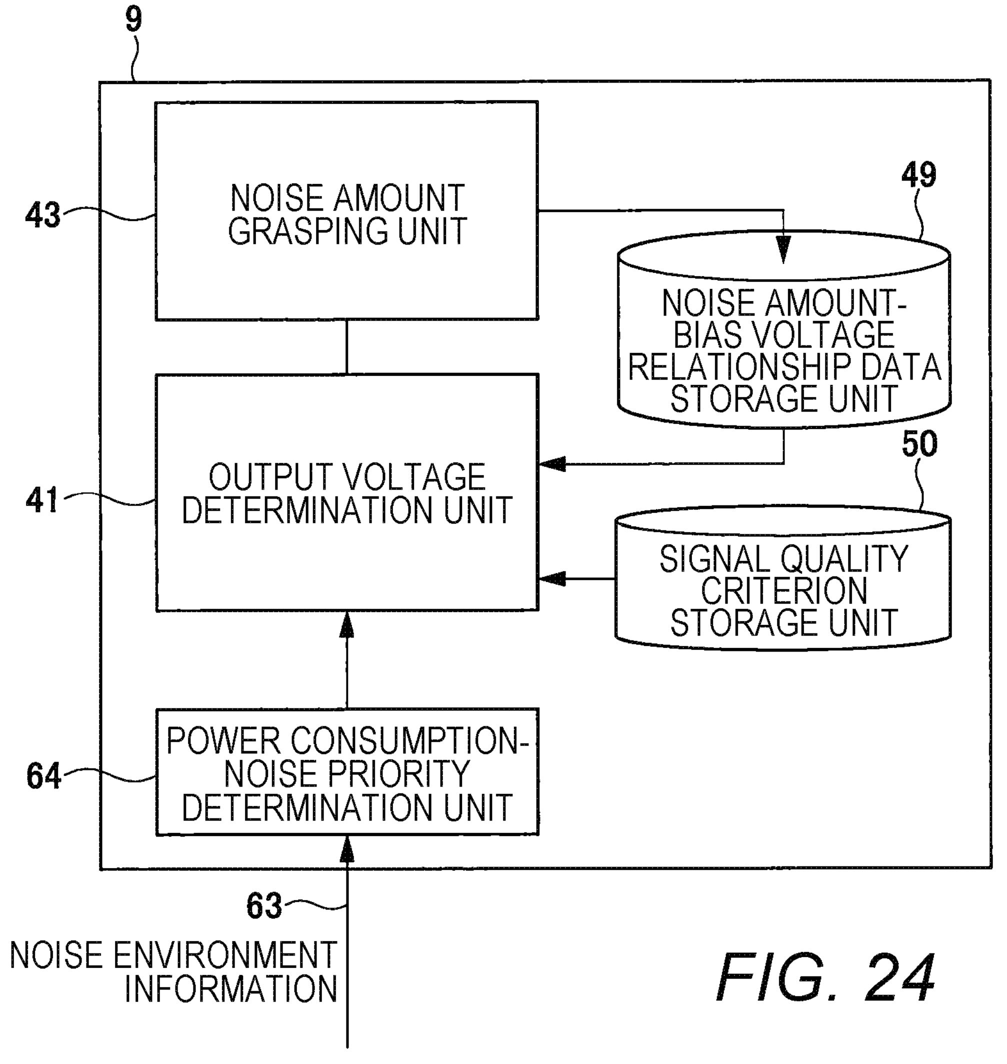
FIG. 24 is a block diagram illustrating a functional configuration example of an information processing LSI of an electronic device to which a signal transmission device according to a sixteenth embodiment of the present invention is applied.

FIG. 24 is a block diagram illustrating a functional configuration example of an information processing LSI of an electronic device to which a signal transmission device according to a sixteenth embodiment of the present invention is applied.

In the embodiment described so far, the output bias voltage is determined only by the information of the noise amount of the differential transmission path, but actually, the bias voltage is also related to the power consumption of the communication system. For example, when the voltage is set low, the supply current in power supply superimposition on the connection destination having a certain power consumption increases, and as a result, the power consumption accompanying the resistance loss of the transmission path may increase.

Therefore, in the present embodiment, a power consumption-noise priority determination unit 64 is provided in the information processing LSI 9 so that the optimum voltage value can be comprehensively determined in consideration of the relationship between the set voltages of the P-side signal wiring 6 and the N-side signal wiring 7 and the power consumption. The power consumption-noise priority determination unit 64 sends the determination result of the priority to the output voltage determination unit 41. For example, when the noise environment information 63 is input and the noise environment is in an excellent state, the power consumption-noise priority determination unit 64 is provided with a determination function that can select a set voltage that prioritizes suppression of power consumption, thereby enabling a configuration of a signal transmission system that balances a noise amount and power consumption.

The noise environment information 63 is information indicating a noise environment of the host vehicle on which the electronic device 1 is mounted. For example, as the noise environment information 63, map information including information of structures and the like, an electromagnetic wave map (electromagnetic wave distribution map) indicating the strength of electromagnetic waves for each place, and the like can be used.

As described above, in the signal transmission device (electronic device) according to the sixteenth embodiment, on the basis of the noise environment information, the output voltage determination unit (output voltage determination unit 41) of the information processing circuit (information processing LSI 9) determines the instruction value of at least one of the first applied voltage (P side) or the second applied voltage (N side) on the basis of the level of priority between the power consumption when communication is performed via the cable connected to the differential wiring and the noise amount in the differential wiring.

Seventeenth Embodiment

Figure 25:
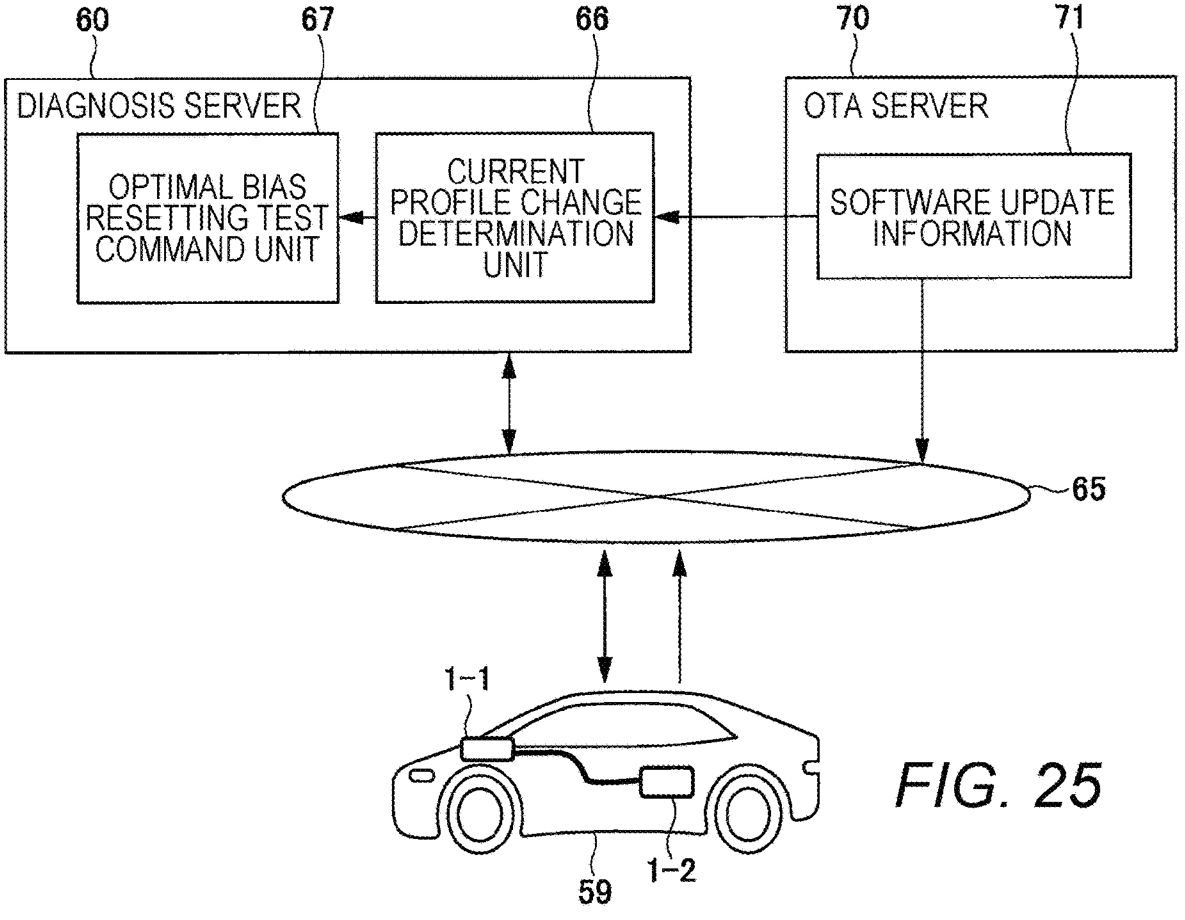
FIG. 25 is a diagram illustrating a configuration example of a solution system including a signal transmission system using an electronic device to which a signal transmission device according to a seventeenth embodiment of the present invention is applied, an OTA server, and the diagnosis server.

FIG. 25 is a diagram illustrating a configuration example of a solution system including a signal transmission system using an electronic device to which a signal transmission device according to a seventeenth embodiment of the present invention is applied, an OTA server, and a diagnosis server.

In the seventeenth embodiment, a solution is described which provides a process of determining an output voltage range again in the vehicle 59 such as an automobile in operation when the noise environment of the vehicle 59 changes due to software update such as over the air (OTA). In the present embodiment, the software update is performed from an OTA server 70 to the vehicle 59 via the network 65 such as the Internet. At this time, the OTA server 70 transmits software update information 71 to the diagnosis server 60, and a current profile change determination unit 66 determines whether there is a change in the current profile related to the noise of the vehicle 59 due to the software update on the diagnosis server 60 side. As a result of the determination, when it is determined that there is a change in the current profile of the vehicle 59, an optimal bias resetting test command unit 67 commands the vehicle 59 to reset the graph of an optimal bias (see FIG. 15).

For example, in a state where the noise environment is excellent (noise is small), the output voltage determination unit 41 (FIG. 24) sets, as the set voltage prioritizing power consumption, the output voltage to be higher than the immediately preceding voltage value or a standard value by a predetermined number of steps.

Figure 26:
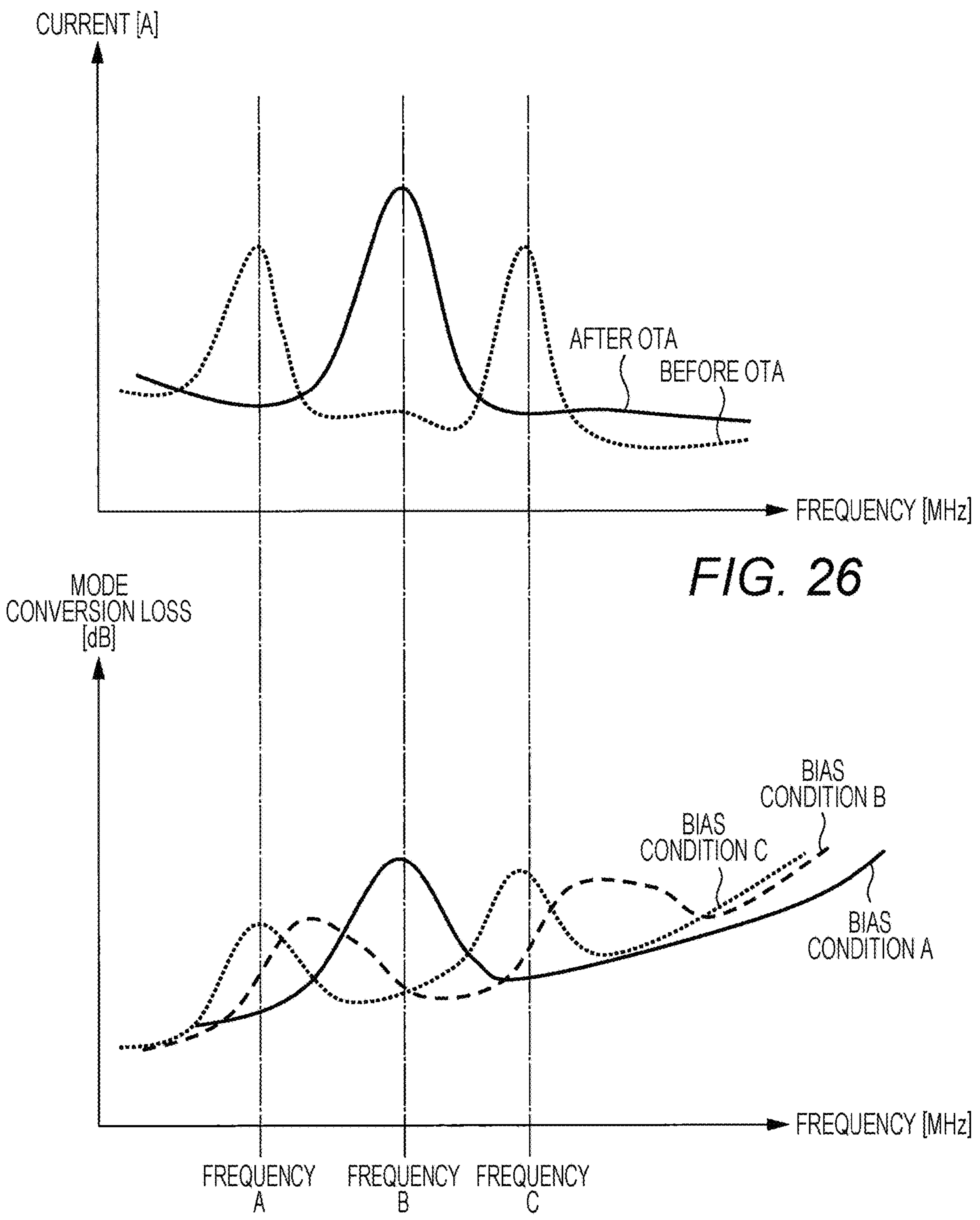
FIG. 26 is a diagram illustrating an example of a method of utilizing a solution system according to the seventeenth embodiment of the present invention.

FIG. 26 is a diagram illustrating an example of a method of utilizing a solution system according to the seventeenth embodiment of the present invention.

An application example of the solution system according to the present embodiment will be described with reference to FIG. 26. The upper graph of FIG. 26 shows a relationship between a frequency [MHz] and a current [A] contributing to noise. The frequency is a main frequency generated from the host vehicle, and examples thereof include a rotational speed of an engine or a motor. For example, when the operation of the DC/DC converter in the vehicle is changed by the software update, the rotation frequency of the motor for rotating the drive wheel is changed. It can be seen that there are peaks at a frequency A and a frequency C before the OTA indicated by a broken line.

On the other hand, the lower graph of FIG. 26 illustrates a relationship between the frequency [MHz] and the mode conversion loss [dB] under various bias conditions. In this example, the mode conversion losses of the frequency A and the frequency C are small under a bias condition A (solid line), and thus the bias condition A is set as the optimum voltage condition before OTA.

However, it is assumed that when the software is updated by the OTA implementation, a change is made such that a peak occurs at the frequency B as indicated by a solid line in the upper graph of FIG. 26. In this case, in the bias condition A, the mode conversion loss has a peak at the frequency B, and thus it can be seen that the voltage becomes inappropriate as a noise condition after OTA.

In this regard, it is desirable to select a bias condition in which there are peaks in the frequencies A and C but there is no peak at the frequency B as in the bias condition C (a broken line with a narrow pitch). In this regard, by providing the optimal bias resetting test command unit 67 in the diagnosis server 60 and incorporating a process of searching for such a bias condition, it is possible to provide a communication system that enables noise optimization even for software update.

As described above, in the solution system (diagnosis service system) according to the seventeenth embodiment, the signal transmission system (communication system) mounted on a moving body such as a vehicle, the software update management server (OTA server 70) that manages update of software in the vehicle via a network, and the diagnosis server (diagnosis server 60) are communicably connected to each other. In the present system, the software update information (software update information 71) of the software update management server (OTA server 70) is transmitted to the diagnosis server. The diagnosis server detects a change in the noise amount from the software update information, and transmits a command for reacquiring the correlation data between the noise amount and the set voltage to the electronic device in the vehicle on the basis of the information on the change in the noise amount.

<Hardware Configuration of Computer>

Next, a hardware configuration of a computer implemented in the electronic devices 1, 1-1, and 1-2, the diagnosis server 60, and the OTA server 70 to which the signal transmission device according to each embodiment is applied will be described.

Figure 27:
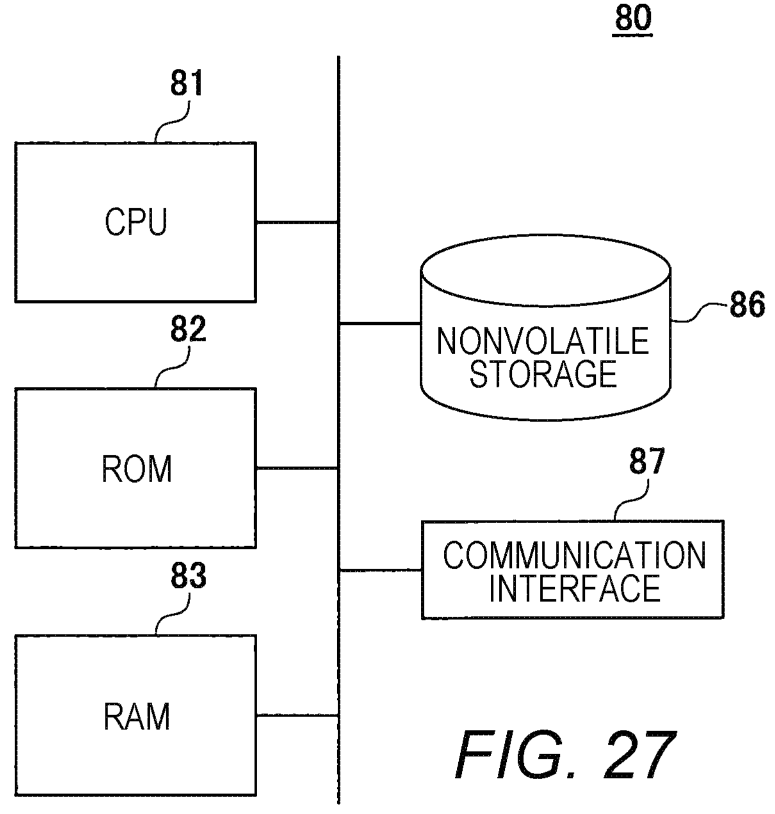
FIG. 27 is a block diagram illustrating a hardware configuration example of a computer of the electronic device to which the signal transmission device according to each embodiment of the present invention is applied, the diagnosis server, and the OTA server.

FIG. 27 is a block diagram illustrating a hardware configuration example of the computer 80. The computer 80 is an example of hardware used as a computer that implements the functions of the electronic devices 1, 1-1, and 1-2, the diagnosis server 60, and the OTA server 70 according to the present embodiment. Each device and each server according to the present embodiment implement the function of each embodiment by the computer 80 (computer) executing a program.

The computer 80 includes a central processing unit (CPU) 81, a read only memory (ROM) 82, and a random access memory (RAM) 83 each connected to a bus. The computer 80 further includes a nonvolatile storage 86 and a communication interface 87.

The CPU 81 reads a program code of software for realizing each function according to the present embodiment from the ROM 82, loads the program code into the RAM 83, and executes the program code. Variables, parameters, and the like generated during arithmetic processing of the CPU 81 are temporarily written to the RAM 83, and these variables, parameters, and the like are appropriately read by the CPU 81. The CPU 81 executes the program code read from the ROM 82, thereby implementing each function according to each embodiment. However, another processor such as a micro processing unit (MPU) may be used instead of the CPU 81.

As the nonvolatile storage 86, for example, a hard disk drive (HDD), a solid state drive (SSD), an optical disk, a magneto-optical disk, a non-volatile memory, or the like is used. In addition to an operating system (OS) and various parameters, a program for causing the computer 80 to function may be recorded in the nonvolatile storage 86. The ROM 82 and the nonvolatile storage 86 record programs, data, and the like necessary for the operation of the CPU 81, and are used as an example of a non-transitory computer-readable storage medium storing a program executed by the computer 80.

For example, a network interface card (NIC) or the like is used as the communication interface 87, and various type of data can be transmitted and received between devices via a local area network (LAN), a dedicated line, or the like connected to the terminal of the NIC. For example, an interface in which the in-vehicle electronic device 1 or the like acquires sensor data from a sensor and an interface in which the electronic device 1 or the like transmits a control command to an actuator are configured by the communication interface 87. In addition, data communication between the in-vehicle electronic device 1 and the like, the diagnosis server 60, and the OTA server 70 is performed by the communication interface 87.

<Modification>

The embodiments and various modifications described above are merely examples, and the present invention is not limited to these embodiments and a modification unless the characteristics of the invention are impaired. In addition, in the above-described various embodiments and the modification, the configurations thereof have been described in detail and specifically in order to describe the present invention in an easy-to-understand manner, and the present invention is not necessarily limited to those including all the described components. Other embodiments considered within the scope of the technical idea of the present invention are also included within the scope of the present invention.

Each of the above-described configurations, functions, processing units, and the like may be realized by hardware by designing a part or all of them with, for example, an integrated circuit. A processor device in a broad sense such as a field programmable gate array (FPGA) or an application specific integrated circuit (ASIC) may be used as the hardware.

In the present specification, the processing steps describing the time-series processing include not only processing performed in time series according to the described order, but also processing executed in parallel or individually (for example, processing by an object) even if the processing is not necessarily performed in time series.

Further, in each of the above-described embodiments, control lines and information lines are those that are considered necessary for explanation, and not all control lines and information lines are necessarily shown on the product. It may be considered that almost all the components are connected to each other in actual.

REFERENCE SIGNS LIST

1 electronic device
2 communication LSI
5 differential wiring
6 P-side signal wiring
7 N-side signal wiring
8 twisted pair cable
9 information processing LSI
10 power supply superimposing filter
14N, 14P AC coupling capacitor
15 common mode choke coil (CMCC)
16 cable connector
17N, 17P electrostatic protection element
18 capacitive load mechanism
30 power supply circuit
41 output voltage determination unit
42 output voltage adjustment function
43 noise amount grasping unit
44 step-up/down circuit
45 inverting step-up/down circuit
46 differential-to-single-end conversion circuit
47-1, 47-2 operational amplifier
48-1 to 48-5 resistance component
49 noise amount-bias voltage relationship data storage unit
50 signal quality criterion storage unit
51 reference counterpart
52 eye waveform monitoring circuit
53 eye waveform information
54 bit error rate evaluation circuit
55 bit error rate information
56 electromagnetic radiation
57 EMI measuring instrument
58 electromagnetic radiation amount information
59 vehicle
60 diagnosis server
61 state history storage unit
62 prediction curve
63 noise environment information
64 power consumption-noise priority determination unit
65 network
70 OTA server
71 software update information
66 current profile change determination unit
67 optimal bias resetting test command unit

The invention claimed is:

1. A signal transmission device comprising:

a first signal wiring and a second signal wiring that constitute a differential wiring;

a communication circuit for transmitting a differential signal to the differential wiring;

an information processing circuit that is connected to the communication circuit and performs processing of various types of information;

a first electronic component that is arranged between the first signal wiring and a ground wiring, wherein the first electronic component comprises a first electrostatic protection element;

a second electronic component that is arranged between the second signal wiring and the ground wiring, wherein the second electronic component comprises a second electrostatic protection element;

a power supply circuit that includes a voltage output circuit outputting a first applied voltage to the first signal wiring and outputting a second applied voltage to the second signal wiring; and a filter component that is arranged between the power supply circuit and each of the first signal wiring and the second signal wiring, wherein the information processing circuit includes an output voltage determination unit that determines an instruction value of at least one of the first applied voltage or the second applied voltage applied by the power supply circuit and that sends the determined instruction value to the power supply circuit, and the power supply circuit has an output voltage adjustment function of adjusting a parameter of the voltage output circuit based at least on parasitic capacitance of the first electrostatic protection element and the second electrostatic protection element, such that the first applied voltage and the second applied voltage reflecting the instruction value received from the output voltage determination unit are output to the first signal wiring and the second signal wiring.

2. The signal transmission device according to claim 1, wherein the information processing circuit includes a noise amount grasping unit that grasps a noise amount in the first signal wiring and the second signal wiring, and the output voltage determination unit determines the instruction value so as to reduce the noise amount for at least one of the first applied voltage or the second applied voltage on a basis of a grasping result of the noise amount grasping unit, and outputs the instruction value to the power supply circuit.

3. The signal transmission device according to claim 2, wherein the parameter of the voltage output circuit is adjusted such that a positive voltage is output to the first signal wiring and a negative voltage is output to the second signal wiring by the output voltage adjustment function of the power supply circuit.

4. The signal transmission device according to claim 1, wherein only a parameter regarding the first applied voltage of the voltage output circuit is able to be adjusted by the output voltage adjustment function of the power supply circuit, and a potential of the second signal wiring is connected to a ground.

5. The signal transmission device according to claim 1, wherein the first applied voltage applied to the first signal wiring is higher than the second applied voltage applied to the second signal wiring, and a capacitive load mechanism corresponding to a difference in parasitic capacitance between the first electronic component and the second electronic component is formed on the first signal wiring on a printed wiring board.

6. The signal transmission device according to claim 2, comprising a storage unit that stores, as correlation data, a relationship between a noise amount of the differential wiring grasped by the noise amount grasping unit and a set voltage when communication is performed in a state where at least one voltage of the first applied voltage or the second applied voltage is set, wherein the output voltage determination unit determines the instruction value of at least one of the first applied voltage or the second applied voltage on a basis of the relationship between the noise amount of the differential wiring and the set voltage.

7. The signal transmission device according to claim 6, comprising a storage unit that stores information of an allowable noise amount of the differential wiring, wherein the output voltage determination unit determines the instruction value of at least one of the first applied voltage or the second applied voltage on a basis of the relationship between the noise amount of the differential wiring and the set voltage as well as the allowable noise amount.

8. The signal transmission device according to claim 2, wherein the noise amount grasping unit grasps the noise amount by using observation information of a signal waveform observation circuit included in the communication circuit.

9. The signal transmission device according to claim 2, wherein the noise amount grasping unit grasps the noise amount by using measurement information of a communication error rate measurement circuit included in the communication circuit.

10. The signal transmission device according to claim 6, wherein the output voltage determination unit determines, on a basis of noise environment information, the instruction value of at least one of the first applied voltage or the second applied voltage on a basis of a level of priority between power consumption when communication is performed via a cable connected to the differential wiring and the noise amount in the differential wiring.

11. A signal transmission system that includes a first signal transmission device having a configuration of the signal transmission device according to claim 3, and a second signal transmission device that communicates with the first signal transmission device via a cable, wherein the second signal transmission device includes:

a third signal wiring that is connected via the cable to a first signal wiring to which a first applied voltage of the first signal transmission device is applied, a fourth signal wiring that is connected via the cable to a second signal wiring to which a second applied voltage of the first signal transmission device is applied, and a voltage conversion circuit that converts positive and negative differential voltages applied via the third signal wiring and the fourth signal wiring into a ground reference voltage.

* * * * *